US009196484B2

(12) United States Patent
Takeda et al.

(10) Patent No.: US 9,196,484 B2

(45) Date of Patent: Nov. 24, 2015

(54) SILICON-CONTAINING COMPOSITION FOR FORMATION OF RESIST UNDERLAYER FILM, WHICH CONTAINS ORGANIC GROUP CONTAINING PROTECTED ALIPHATIC ALCOHOL

(75) Inventors: Satoshi Takeda, Toyama (JP); Makoto Nakajima, Toyama (JP); Yuta Kanno, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/825,158

(22) PCT Filed: Sep. 14, 2011

(86) PCT No.: PCT/JP2011/071013

§ 371 (c)(1), (2), (4) Date: Mar. 20, 2013

(87) PCT Pub. No.: WO2012/039337

PCT Pub. Date: Mar. 29, 2012

(65) Prior Publication Data

US 2013/0183830 A1 Jul. 18, 2013

(30) Foreign Application Priority Data

Sep. 21, 2010 (JP) ................................ 2010-210694

(51) Int. Cl.

| | |
|---|---|
| ***H01L 21/311*** | (2006.01) |
| ***H01L 21/033*** | (2006.01) |
| ***G03F 7/075*** | (2006.01) |
| ***G03F 7/09*** | (2006.01) |
| ***C09D 183/04*** | (2006.01) |
| *C08G 77/14* | (2006.01) |
| *C08G 77/16* | (2006.01) |

(52) U.S. Cl.

CPC .......... *H01L 21/0332* (2013.01); *C09D 183/04* (2013.01); *G03F 7/0752* (2013.01); *G03F 7/091* (2013.01); *G03F 7/094* (2013.01); *C08G 77/14* (2013.01); *C08G 77/16* (2013.01)

(58) Field of Classification Search

CPC ...... H01L 21/312; H01L 21/0332; G03F 1/56

USPC .................. 438/725, 780, 781; 430/313, 316

See application file for complete search history.

(56) References Cited

U.S. PATENT DOCUMENTS

| | | | | |
|---|---|---|---|---|
| 2008/0312400 | A1 | 12/2008 | Yamashita et al. | |
| 2008/0318171 | A1 | 12/2008 | Tsubaki | |
| 2010/0291487 | A1* | 11/2010 | Nakajima et al. | 430/313 |
| 2011/0076625 | A1 | 3/2011 | Tsubaki | |
| 2011/0287369 | A1* | 11/2011 | Shibayama et al. | 430/316 |

FOREIGN PATENT DOCUMENTS

| | | |
|---|---|---|
| JP | A 10-209134 | 8/1998 |
| JP | A 11-258813 | 9/1999 |
| JP | A 2005-48152 | 2/2005 |
| JP | A 2006-285095 | 10/2006 |
| JP | A 2007-65161 | 3/2007 |
| JP | A 2007-226204 | 9/2007 |
| JP | A 2008-158002 | 7/2008 |
| JP | A 2008-309879 | 12/2008 |
| JP | A 2008-309929 | 12/2008 |
| JP | A 2009-229708 | 10/2009 |
| JP | A 2009-237363 | 10/2009 |

OTHER PUBLICATIONS

Oct. 25, 2011 Search Report issued in International Patent Application No. PCT/JP2011/071013.

Oct. 25, 2011 Written Opinion issued in International Patent Application No. PCT/JP2011/071013 (with translation).

* cited by examiner

*Primary Examiner* — Brook Kebede

(74) *Attorney, Agent, or Firm* — Oliff PLC

(57) ABSTRACT

Described herein are compositions for forming an underlayer film for a solvent-developable resist. These compositions can include a hydrolyzable organosilane having a silicon atom bonded to an organic group containing a protected aliphatic alcohol group, a hydrolysate of the hydrolyzable organosilane, a hydrolysis-condensation product of the hydrolyzable organosilane, or a combination thereof and a solvent. The composition can form a resist underlayer film including, a hydrolyzable organosilane, a hydrolysate of the hydrolyzable organosilane, a hydrolysis-condensation product of the hydrolyzable organosilane, or a combination thereof, the silicon atom in the silane compound having a silicon atom bonded to an organic group containing a protected aliphatic alcohol group in a ratio of 0.1 to 40% by mol based on the total amount of silicon atoms. Also described is a method for applying the composition onto a semiconductor substrate and baking the composition to form a resist underlayer film.

7 Claims, No Drawings

SILICON-CONTAINING COMPOSITION FOR FORMATION OF RESIST UNDERLAYER FILM, WHICH CONTAINS ORGANIC GROUP CONTAINING PROTECTED ALIPHATIC ALCOHOL

TECHNICAL FIELD

The present invention relates to a composition for forming an underlayer film between a substrate and a resist (for example, a photoresist and an electron beam resist) used in the production of a semiconductor device. More specifically, the present invention relates to a lithography resist underlayer film-forming composition that is for forming an underlayer film used underneath a solvent-developable photoresist in a lithography process in the production of a semiconductor device. The present invention also relates to a method for producing a semiconductor device using the composition for forming an underlayer film.

BACKGROUND ART

Conventionally, in the production of semiconductor devices, microfabrication by lithography using a photoresist has been carried out. The microfabrication is a machining process in which a thin film of a photoresist is formed on a semiconductor substrate such as a silicon wafer, active light such as ultraviolet light is applied onto the substrate through a mask pattern with a pattern of a semiconductor device followed by development, the substrate is etched using the obtained photoresist pattern as a protective film, and a fine concave-convex corresponding to the pattern is consequently formed on the substrate surface.

In recent years, semiconductor devices have been further integrated, and the active light to be used has changed from an excimer laser (248 nm) to an ArF excimer laser (193 nm) that has a shorter wavelength. Such a change has raised a problem of the effect of reflections of active light from a semiconductor substrate. To address the problem, a method for providing an anti-reflective coating (bottom anti-reflective coating) between a photoresist and a substrate has been widely studied.

As the photoresist underlayer film between a semiconductor substrate and a photoresist, a film that contains a metallic element such as silicon and titanium and that is known as a hard mask has been used (for example, see Patent Document 1). In this case, components are greatly different between the resist and the hard mask and, when the resist and the hard mask are removed by dry etching, each removal rate largely depends on gas species used in the dry etching. On this account, appropriate selection of gas species enables the hard mask alone to be removed by dry etching without large reduction in the film thickness of the photoresist.

In this manner, in recent production of semiconductor devices, a resist underlayer film has been provided between a semiconductor substrate and a photoresist in order to achieve various effects including anti-reflection effect. Thus, a composition for the resist underlayer film has been studied. However, there is a demand for a new material for the resist underlayer film due to a wide variety of characteristics required.

For example, a composition and pattern formation method using a compound having a silicon-silicon bond are known (for example, see Patent Document 2).

An anti-reflective coating material that includes a light absorbable silicone resin having a weight average molecular weight of 30,000 or less and containing a constituent having a molecular weight of less than 600 in an amount of 5% or less based on the total amount, a first acid generator having a decomposition temperature of 200° C. or less, and an organic solvent is disclosed (for example, see Patent Document 3).

PRIOR ART DOCUMENTS

Patent Documents

Patent Document 1: Japanese Patent Application Publication No. 11-258813 (JP 11-258813 A)
Patent Document 2: Japanese Patent Application Publication No. 10.209134 (JP 10-209134 A)
Patent Document 3: Japanese Patent Application Publication No. 2007-226204 (JP 2007-226204 A)

SUMMARY OF THE INVENTION

Problem to be Solved by the Invention

It is an object of the present invention to provide a composition for forming a lithography resist underlayer film usable in the production of semiconductor devices, and specifically, a composition for forming a lithography resist underlayer film, which is used to form a resist underlayer film usable as a hard mask and also as an anti-reflective coating.

In particular, the present invention has an object to provide a lithography resist underlayer film that does not cause intermixing with a resist formed on the resist underlayer film and that has a dry etching rate larger than that of a resist and to provide a composition for forming a resist underlayer film, which is used to form the underlayer film.

The present invention also has an object to provide an underlayer film for a solvent-developable resist that enables the formation of a good resist pattern in the case of using a resist that is to be developed with a solvent and to provide a composition for forming the resist underlayer film.

Means for Solving the Problem

The present invention relates to, as a first aspect, a composition for forming an underlayer film for a solvent-developable resist, the composition including a hydrolyzable organosilane having a silicon atom bonded to an organic group containing a protected aliphatic alcohol group, a hydrolysate of the hydrolyzable organosilane, a hydrolysis-condensation product of the hydrolyzable organosilane, or a combination of these, and a solvent.

The present invention relates to, as a second aspect, the composition for forming an underlayer film according to the first aspect, in which the composition for forming a resist underlayer film including, as a silane compound, the hydrolyzable organosilane, a hydrolysate of the hydrolyzable organosilane, a hydrolysis-condensation product of the hydrolyzable organosilane, or a combination of these contains the silicon atom in the silane compound having a silicon atom bonded to an organic group containing a protected aliphatic alcohol group in a ratio of 0.1 to 40% by mol based au the total amount of silicon atoms.

The present invention relates to, as a third aspect, the composition for forming an underlayer film according to the first aspect or the second aspect, in which the hydrolyzable organosilane is an organosilane of Formula (1):

$$R^1{}_aR^2{}_bSi(R^3)_{4-(a+b)} \qquad \text{Formula (1)}$$

(where $R^1$ is a monovalent organic group containing a protected aliphatic alcohol group and is bonded to the silicon atom in Formula (1) through a Si—C bond; $R^2$ is an alkyl group, an aryl group, a halogenated alkyl group, a halogenated aryl group, an alkenyl group, or a monovalent organic group having an epoxy group, an acryloyl group, a methacryloyl group, a mercapto group, or a cyano group and is bonded to the silicon atom in Formula (1) through a Si—C bond; $R^3$ is an alkoxy group, an acyloxy group, or a halogen atom; a is an integer of 1 or 2; b is an integer of 0 or 1; and a+b is an integer of 1 or 2).

The present invention relates to, as a fourth aspect, the composition for forming an underlayer film according to any one of the first aspect to the third aspect, in which the organic group containing a protected aliphatic alcohol group is an organic group of Formula (2):

$$—R^4—O—R^5 \qquad \text{Formula (2)}$$

(where $R^4$ is a $C_{1-10}$ alkylene group; and $R^5$ is a monovalent group selected from a $C_{1-10}$ alkyl group, a $C_{6-20}$ aryl group, a $C_{2-10}$ alkenyl group, and a formyl group or the monovalent group to which at least one divalent group selected front the group consisting of a $C_{1-10}$ alkylene group, a $C_{2-10}$ arylene group, an ether group, an ester group, a sulfide group, and a carbonyl group is inserted).

The present invention relates to, as a fifth aspect, the composition for forming an underlayer film according to any one of the first aspect to the fourth aspect, in which the composition includes a combination of the hydrolyzable organosilane of Formula (1) and at least one silicon-containing compound selected from the group consisting of a silicon compound of Formula (3):

$$R^6{}_aSi(R^7)_{4-a} \qquad \text{Formula (3)}$$

(where $R^6$ is an unsubstituted or substituted alkyl group, an unsubstituted or substituted aryl group, a halogenated alkyl group, a halogenated aryl group, an alkenyl group, or a monovalent organic group having an epoxy group, an acryloyl group, a methacryloyl group, a mercapto group, or a cyano group and is bonded to the silicon atom in Formula (3) through a Si—C bond; $R^7$ is an alkoxy group, an acyloxy group, or a halogen atom; and a is an integer of 0 to 3) and a silicon-containing compound of Formula (4):

$$[R^8{}_cSi(R^9)_{3-c}]_2Y_b \qquad \text{Formula (4)}$$

(where $R^8$ is an alkyl group; $R^9$ is an alkoxy group, an acyloxy group, or a halogen atom; Y is an alkylene group or an arylene group; b is en integer of 0 or 1; c is an integer of 0 or 1; and when b=0, a Si—Si single bond is formed), a hydrolysate of the combination, or a hydrolysis-condensation product of the combination.

The present invention relates to, as a sixth aspect, the composition for forming an underlayer film according to the fifth aspect, in which the composition includes a hydrolysis-condensation product of the hydrolyzable organosilane of Formula (1) or a hydrolysis-condensation product of the hydrolyzable organosilane of Formula (1) and the silicon-containing compound of Formula (3) as a polymer.

The present invention relates to, as a seventh aspect, the composition for forming an underlayer film according to any one of the first aspect to the sixth aspect, further including water.

The present invention relates to, as an eighth aspect, a resist underlayer film on a substrate, the resist underlayer film being produced by applying the composition for forming a resist underlayer film as described in any one of the first aspect to the seventh aspect onto a semiconductor substrate and baking the composition.

The present invention relates to, as a ninth aspect, a method for producing a semiconductor device, the method including applying the composition for forming a resist underlayer film as described in any one of the first aspect to the seventh aspect onto a semiconductor substrate and baking the composition to form a resist underlayer, film, applying a resist composition onto the underlayer film to form a resist film, exposing the resist film to light, developing the resist after exposure with a solvent to afford a resist pattern, etching the resist underlayer film based on the resist pattern, and fabricating the semiconductor substrate based on the patterned resist film and resist underlayer film.

The present invention relates to, as a tenth aspect, a method for producing a semiconductor device, the method including forming an organic underlayer film on a semiconductor substrate, applying the composition for forming a resist underlayer film as described in any one of the first aspect to the seventh aspect onto the organic underlayer film and baking the composition to form a resist underlayer film, applying a resist composition onto the underlayer film to form a resist layer, exposing the resist film to light, developing the resist after exposure with a solvent to afford a resist pattern, etching the resist underlayer film based on the resist pattern, etching the organic underlayer film based on the patterned resist underlayer film, and fabricating the semiconductor substrate based on the patterned resist film, resist underlayer film, and organic underlayer film.

Effects of the Invention

With a resist underlayer film formed from the composition for forming a resist underlayer film of the present invention, it is possible to achieve a fine pattern on a resist formed on the resist underlayer film. In other words, in the case where an overcoating resist is a solvent developable resist, for example, when a positive resist is used, an unexposed area of the resist film is insoluble in water and soluble in a solvent. On the other hand, when a negative resist is used, an unexposed area of the resist film has a non-crosslinked structure and is soluble in a solvent. Here, a resist underlayer film that is formed from the composition of the present invention and contains a polysiloxane enables the formation of a fine resist shape in a solvent removal process.

An underlayer film formed from the composition for forming a resist underlayer film of the present invention has a polyorganosiloxane structure, so the underlayer film has sufficient dry etching resistivity with respect to an oxygen-containing dry etching gas. On this account, the underlayer film has advantageous effects on etching of an organic underlayer film present underneath or as a hard mask for oxygen dry etching used for fabrication (etching) of a substrate.

MODES FOR CARRYING OUT THE INVENTION

The present invention covers a composition for forming a resist underlayer film, which will be specifically described later, and the applications of the composition are as follows. That is, on a substrate, the composition is used to form a resist underlayer film by coating or, in some cases, on an organic underlayer film formed on a substrate, the composition is used to form a resist underlayer film by coating, and on the resist underlayer film, a resist film (for example, a photoresist and an electron beam resist) is formed. Then, a resist pattern is formed by exposure and development, and the resist underlayer film is dry etched based on the resist pattern so that the pattern is transferred. The substrate is fabricated based on the pattern, or the pattern is transferred to the organic underlayer film by etching and the substrate is fabricated based on the organic underlayer film.

Specifically, after the formation of a resist pattern, using the pattern as a mask, the underlying resist underlayer film containing a silicon compound of the present invention is dry etched with a halogen-containing gas and the pattern is transferred to the resist underlayer film. Then, using the pattern transferred to the underlayer film as a mask, a substrate is fabricated using a halogen-containing gas. Alternatively, using the pattern transferred to the underlayer film as a mask, the underlying organic underlayer film is dry etched with an oxygen-containing gas and the pattern is transferred to the organic underlayer film. Then, using the organic underlayer film with the transferred pattern as a mask, a substrate is fabricated using a halogen-containing gas.

In recent years, in order to suppress pattern falling in the formation of a fine pattern, a resist tends to have a smaller film thickness. On this account, for transferring a good resist pattern to a film (underlayer film) present underneath the resist film, the underlayer film is required to have an etching rate higher than the dry etching rate gram upper resist film.

In view of the above circumstances, the inventors of the present invention have studied the structure in which, onto an organic underlayer film formed on a substrate or onto a substrate with no organic underlayer film, a composition containing an inorganic component is applied to form an underlayer film and an organic resist film is formed on the underlayer film. This study is made by focusing on the fact that an organic component film has a high dry etching rate with an oxygen-containing gas and an inorganic component film has a high dry etching rate with a halogen-containing gas. Appropriate selection of these etching gases enables the dry etching rate to largely vary between two laminated layers.

As a result, the inventors of the present invention have found that, by adopting as the inorganic component a silicon compound, more specifically, a hydrolyzable organosilane of Formula (1) containing an organic group containing a protected aliphatic alcohol group in the molecule, a hydrolyzable group (such as an alkoxy group, an acyloxy group, and a halogen group) in the structure of the silicon compound is hydrolyzed or partially hydrolyzed and a subsequent condensation reaction of a silanol group leads to the formation of a polymer containing a polysiloxane structure having a sufficient function as a hard mask and leads to the formation of a resist underlayer film having a higher dry etching rate with a fluorine-containing gas and capable of maintaining a good pattern even after the development of a resist with a solvent, and the present invention has been accomplished.

The present invention will now be described in detail.

The present invention relates to a composition for forming an underlayer film for a solvent-developable resist. In particular, the composition includes a hydrolyzable organosilane containing an organic group containing a protected aliphatic alcohol group in the molecule, a hydrolysate of the hydrolyzable organosilane, or a hydrolysis-condensation product of the hydrolyzable organosilane and a solvent as essential components.

[Organosilane Component]

In the composition for forming an underlayer film of the present invention, as described above, the hydrolyzable organosilane having a silicon atom bonded to an organic group containing a protected aliphatic alcohol group, the hydrolysate of the hydrolyzable organosilane, and the hydrolysis-condensation product as a condensation product of the obtained hydrolysate may be used as a mixture form of them. A mixture of a hydrolyzable organosilane compound that is a raw material for obtaining a hydrolysis-condensation product, a partial hydrolysate in which hydrolysis has not been thoroughly completed, and a hydrolysis-condensation product may also be used.

The hydrolysis-condensation product is a polymer having a polysiloxane structure, specifically, a polymer having a structure in which an organic group containing a protected aliphatic alcohol group is bonded to the silicon atom of the polysiloxane.

In the present invention, a composition for forming a resist underlayer film including the hydrolyzable organosilane, a hydrolysate of the hydrolyzable organosilane, a hydrolysis-condensation product of the hydrolyzable organosilane, or a combination of these as the slime compound preferably contains the silicon atom in the silane compound having a silicon atom bonded to an organic group containing a protected aliphatic alcohol group in a ratio of 0.1 to 40% by mol based on the total amount of silicon atoms.

The composition for forming a resist underlayer film of the present invention may include a curing catalyst, an acid, water, an alcohol, a bisphenol S, another organic polymer, an acid generator, a light absorbing compound, a surfactant, and other components described later as optional components.

The solid content in the composition for forming a resist underlayer film of the present invention is, for example, 0.5 to 50% by mass, 1 to 30% by mass, or 1 to 25% by mass. Here, the solid content is a content of the whole components of the composition for forming a film (resist underlayer film) except the solvent component.

The total ratio of the hydrolyzable organosilane, the hydrolysate of the hydrolyzable organosilane, and the hydrolysis-condensation product of the hydrolyzable organosilane is 20% by mass or more, for example, 50 to 100% by mass, 60 to 100% by mass, or 70 to 100% by mass in the solid content.

The hydrolyzable organosilane included in the composition for forming a resist underlayer film of the present invention is, for example, an organosilane having the structure or Formula (1).

In Formula, $R^1$ is an organic group containing a protected aliphatic alcohol group and is bonded to the silicon atom in Formula (1) through a Si—C bond.

$R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group and is bonded to the silicon atom in Formula (1) through a Si—C bond.

$R^3$ is an alkoxy group, an acyloxy group, or a halogen atom. a is an integer of 1 or 2, b is an integer of 0 or 1, and a+b is an integer of 1 or 2.

As the alkyl group in Formula (1), a $C_{1-10}$ alkyl group having a linear or branched chain can be exemplified. Examples of the alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n- pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

As the aryl group in Formula (1), a $C_{6-20}$ aryl group can be exemplified. Examples of the aryl group include a phenyl group, a benzyl group, a phenethyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

As the alkenyl group in Formula (1), a $C_{2-10}$ alkenyl group can be exemplified. Examples of the alkenyl group include an ethenyl group (vinyl group), a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-Methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and 3-cyclohexenyl group.

As the halogenated alkyl group and the halogenated aryl group in Formula (1), an alkyl group or an aryl group in which at least one hydrogen atom in the alkyl group or the aryl group exemplified above is replaced by a halogen atom such as a fluorine atom, a chlorine atom, a bromine atom, and an iodine atom can be exemplified.

Examples of the organic group having an epoxy group in Formula (1) include an glycidoxy methyl group, a glycidoxy ethyl group, a glycidoxy propyl group, a glycidoxy butyl group, an epoxycyclohexyl group, an (epoxycyclohexyl)methyl group, an (epoxycyclohexyl)ethyl group, an (epoxycyclohexyl)propyl group, and an (epoxycyclohexyl)butyl group.

Examples of the organic group having an acryloyl group in Formula (1) include an acryloylmethyl group, an acryloylethyl group, and an acryloylpropyl group.

Examples of the organic group having a methacryloyl group in Formula (1) include a methacryloylmethyl group, a methacryloylethyl group, a methacryloylpropyl group, and a methacryloyloxypropyl group.

Examples of the organic group having a mercapto group in Formula (1) include a mercaptoethyl group, a mercaptobutyl group, a mercaptohexyl group, and a mercaptooctyl group.

Examples of the organic group having a cyano group in Formula (1) include a cyanoethyl group and a cyanopropyl group.

As the alkoxy group in Formula (1), an alkoxy group having a $C_{1-20}$ linear, branched, or cyclic alkyl moiety and an alkoxy group having a $C_{6-10}$ aryl moiety can be exemplified. Examples of the alkoxy group include a methoxy group, an ethoxy group, an n-propoxy group, an i-propoxy group, an n-butoxy group, an i-butoxy group, an s-butoxy group, a t-butoxy group, an n-pentyloxy group (amyloxy group), a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n- butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, a phenoxy group, a benzyloxy group, and a phenethyloxy group.

As the acyloxy group in Formula (1), a $C_{2-20}$ acyloxy group can be exemplified. Examples of the acyloxy group include a methylcarbonyloxy group (acetoxy group), an ethylcarbonyloxy group, an n-propylcarbonyloxy group, an i-propylcarbonyloxy group, a cyclopropylcarbonyloxy group, an n-butylcarbonyloxy group, an i-butylcarbonyloxy group, an s-butylcarbonyloxy group, a t-butylcarbonyloxy group, a cyclobutylcarbonyloxy group, a 1-methyl-cyclopropylcarbonyloxy group, a 2-methyl-cyclopropylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a cyclopentylcarbonyloxy group, a 1-methyl-cyclobutylcarbonyloxy group, a 2-methyl-cyclobutylcarbonyloxy group, a 3-methyl-cyclobutylcarbonyloxy group, a 1,2-dimethyl-cyclopropylcarbonyloxy group, a 2,3-dimethyl-cyclopropylcarbonyloxy group, a 1-ethyl-cyclopropylcarbonyloxy group, a 2-ethyl-cyclopropylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, and a 1,1,2-trimethyl-n-propylcarbonyloxy group.

Examples of the halogen atom in Formula (1) include a fluorine atom, a chlorine atom, a bromine atom, and an iodine atom.

$R^1$ in Formula (1) is an organic group containing a protected aliphatic alcohol group, and preferred examples of the organic group include an organic group of Formula (2).

In Formula (2), $R^4$ is a $C_{1-10}$ alkylene group.

$R^5$ is a monovalent group selected from a $C_{1-10}$ alkyl group, a $C_{6-20}$ aryl group, a $C_{2-10}$ alkenyl group, and a formyl group or the monovalent group to which at least one divalent group selected from the group consisting of a $C_{1-10}$ alkylene group, a $C_{2-10}$ arylene group, an ether group (—O—), an ester group (—(CO)O—), a sulfide group (—S—), and a carbonyl group (—(CO)—) is inserted.

The alkylene group is a divalent organic group derived from an alkyl group, and examples of the alkyl group include groups exemplified as the $C_{1-10}$ alkyl group having a linear or branched chain in Formula (1).

The arylene group is a divalent organic group derived from an aryl group, and examples of the aryl group include groups exemplified as the $C_{6-20}$ aryl group in Formula (1).

Examples of the alkenyl group include groups exemplified as the $C_{2-10}$ alkenyl group in Formula (1).

Specific examples of the hydrolyzable organosilane of Formula (1) include compounds of Formula (A-1) to Formula (A-39). In Formula (A-1) to Formula (A-39), X is the alkoxy group, the acyloxy group, or the halogen atom described above.

Formula (A-1)

Formula (A-2)

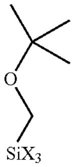

Formula (A-3)

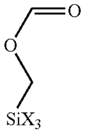

Formula (A-4)

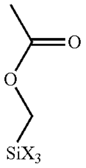

Formula (A-5)

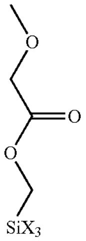

Formula (A-6)

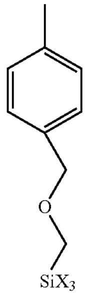

Formula (A-7)

-continued
Formula (A-8)
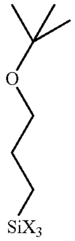
Formula (A-9)
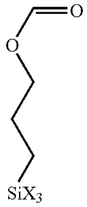
Formula (A-10)
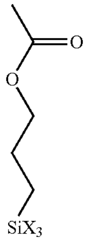
Formula (A-11)
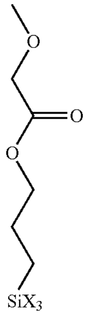
Formula (A-12)
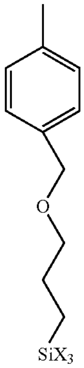
Formula (A-13)
-continued
Formula (A-15)
Formula (A-16)
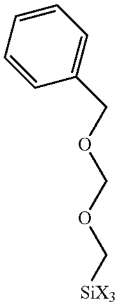
Formula (A-17)
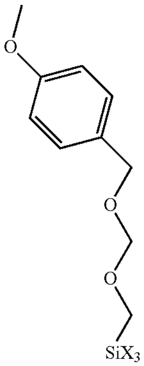
Formula (A-18)
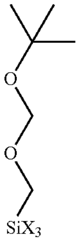
Formula (A-19)
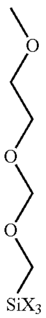

-continued
Formula (A-20)
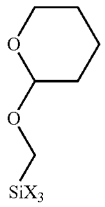
Formula (A-21)
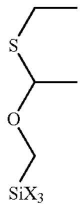
Formula (A-22)
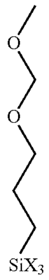
Formula (A-23)
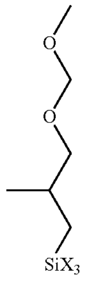
Formula (A-24)
-continued
Formula (A-25)
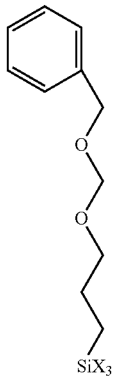
Formula (A-26)
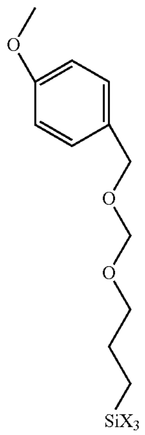
Formula (A-27)
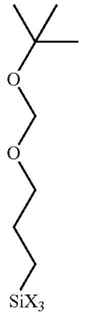
Formula (A-28)
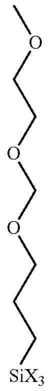

-continued

Formula (A-29)

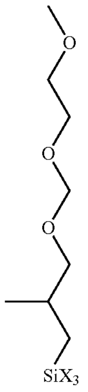

Formula (A-30)

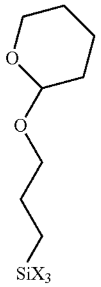

Formula (A-31)

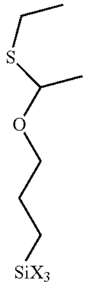

Formula (A-32)

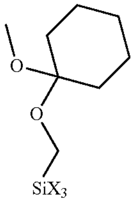

Formula (A-33)

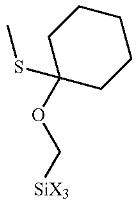

Formula (A-34)

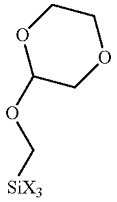

-continued

Formula (A-35)

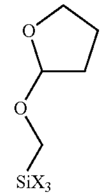

Formula (A-36)

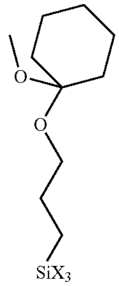

Formula (A-37)

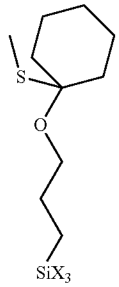

Formula (A-38)

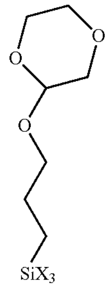

Formula (A-39)

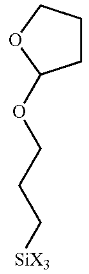

These hydrolyzable organosilanes containing an organic group containing a protected aliphatic alcohol group are available from Gelest, Inc. as commercial products. Unavailable hydrolyzable organosilanes can be synthesized by hydrosilylation. In other words, such a hydrolyzable organosilane can be synthesized by the reaction of a compound having a carbon-carbon double bond and a hydrolyzable silane having a hydrogen-silicon bond.

In the composition for forming an underlayer film of the present invention, a combination of the hydrolyzable organosilane of Formula (1) and at least one silicon-containing compound selected from the group consisting of silicon-containing compounds of Formula (3) and Formula (4), a hydrolysate of the compounds, or a hydrolysis-condensation product of the compounds can be used.

The hydrolyzable organosilane of Formula (1), a hydrolysate of the hydrolyzable organosilane, or a hydrolysis-condensation product of the hydrolyzable organosilane can be used in combination with at least one silicon-containing compound selected from the group consisting of silicon-containing compounds of Formula (3) and Formula (4), a hydrolysate of the silicon-containing compound, or a hydrolysis-condensation product of the silicon-containing compound.

In other words, in the present invention, at least one of the hydrolyzable organosilane of Formula (1), a hydrolysate of the hydrolyzable organosilane, and a hydrolysis-condensation product of the hydrolyzable organosilane can be used in combination with at least one selected from the group consisting of the silicon-containing compounds of Formula (3) and Formula (4), hydrolysates of the silicon-containing compounds, and hydrolysis-condensation products of the silicon-containing compounds. A hydrolysis-condensation product of the hydrolyzable organosilane of Formula (1) and at least one silicon-containing compound selected from the group consisting of the silicon-containing compounds of Formula (3) and Formula (4) can be used.

The ratio of the hydrolyzable organosilane of Formula (1) (including a hydrolysate and a hydrolysis-condensation product derived from the hydrolyzable organosilane) and the silicon-containing compound of Formula (3) and/or Formula (4) (including a hydrolysate and a hydrolysis-condensation product derived from the silicon-containing compound) is in a range from 1:0 to 1:100,000 or 1:0.1 to 1:10, in terms of molar ratio.

In the composition for forming an underlayer film of the present invention, of the silicon-containing compounds selected from the group consisting of compounds of Formula (3) and Formula (4), the silicon-containing compound of Formula (3) is preferably used.

These compounds are preferably used as a hydrolysis-condensation product (polyorganosiloxane) and are particularly preferably used as a hydrolysis-condensation product (polyorganosiloxane) of the hydrolyzable organosilane of Formula (1) and the silicon-containing compound of Formula (3).

In the silicon-containing compounds of Formula (3) and Formula (4), specific examples of the alkyl group, the aryl group, the halogenated alkyl group, the halogenated aryl group, the alkenyl group, or the organic group having an epoxy group, an acryloyl group, a methacryloyl group, a mercapto group, or a cyano group in $R^6$ and $R^8$ and the alkoxy group, the acyloxy group, or the halogen atom, which is a hydrolyzable group, in $R^7$ and $R^9$ include respective groups exemplified in Formula (1).

Examples of the substituent in $R^6$ include an alkyl group, an alkylene group, and a group in which any group of them is combined with at least one group of an alkylene group, an arylene group, an ether group, an ester group, and a carbonyl group (such a group may interrupt the alkyl group or the alkylene group).

Examples of the alkylene group in Y include divalent organic groups derived from the groups that are exemplified as the $C_{1-10}$ alkyl group having a linear or branched chain in Formula (1), and examples of the arylene group in Y include divalent organic groups derived from the group that are exemplified as the $C_{6-20}$ aryl group in Formula (1).

Examples of the silicon-containing compound of Formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldimethoxysilane, α-glycidoxyethylmethyldimethoxysilane, α-glycidoxyethylmethyldimethoxysilane, β-glycidoxyethylmethyldimethoxysilane, β-glycidoxyethylmethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldimethoxysilane, γ-glycidoxypropylvinyldimethoxysilane, γ-glycidoxypropylvinyldimethoxysilane, ethyltrimethoxysilane, ethyltriethoxysilane, vinyltrimethoxysilane, vinyltrichlorosilane, vinyltriacetoxysilane, vinyltriethoxysilane, phenyltrimethoxysilane, phenyltrichlorosilane, phenyltriacetoxysilane, phenyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltriamethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloyloxypropyltrimethoxysilane, γ-mercaptopropyltrimethoxysilane, 1-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloyloxypropylmethyldimethoxysilane, γ-methacryloyloxypropylmethyldiethoxysilane, γ-mercaptopropylmethyldimethoxysilane, γ-mercaptomethyldiethoxysilane, methylvinyldimethoxysilane, and methylvinyldiethoxysilane.

As the silicon-containing compound of Formula (3), compounds of Formula (B-1) to Formula (B-32) can also be used. X is the alkoxy group, the acyloxy group, and the halogen atom described above.

Formula (B-1)

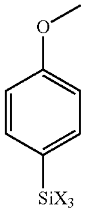

Formula (B-2)

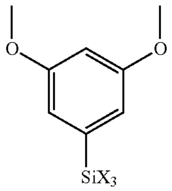

Formula (B-3)

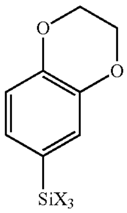

-continued

Formula (B-4)

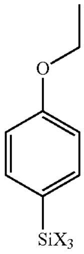

Formula (B-5)

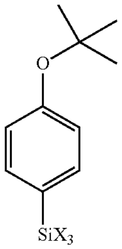

Formula (B-6)

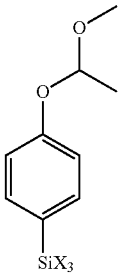

Formula (B-7)

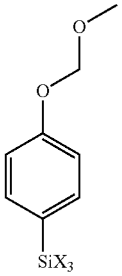

Formula (B-8)

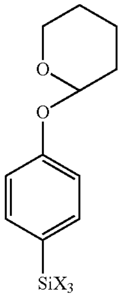

-continued
Formula (B-9)
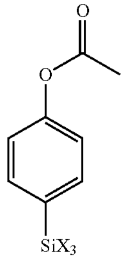
Formula (B-10)
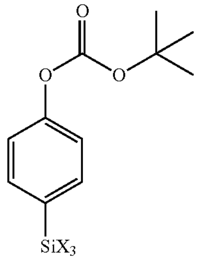
Formula (B-11)
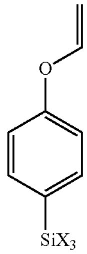
Formula (B-12)
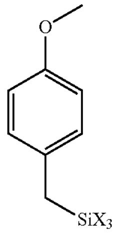
Formula (B-13)
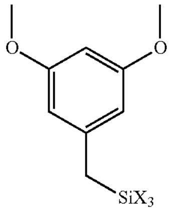
Formula (B-14)
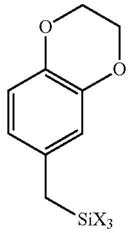
-continued
Formula (B-15)
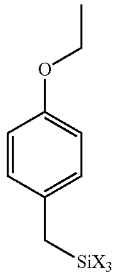
Formula (B-16)
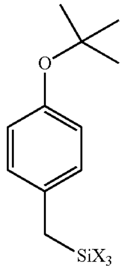
Formula (B-17)
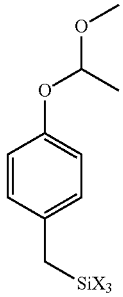
Formula (B-18)
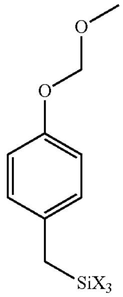
Formula (B-18)
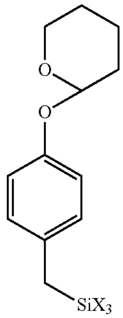

-continued
Formula (B-19)
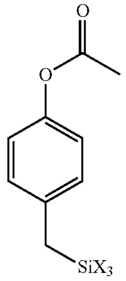
Formula (B-20)
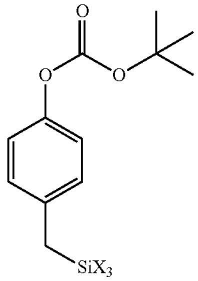
Formula (B-21)
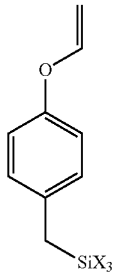
Formula (B-22)
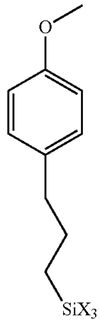
Formula (B-23)
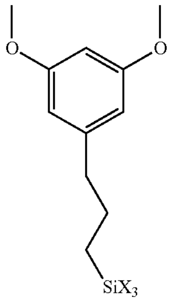
-continued
Formula (B-24)
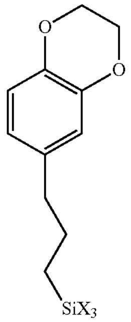
Formula (B-25)
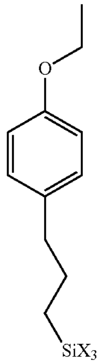
Formula (B-26)
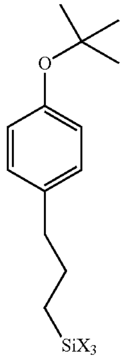
Formula (B-27)
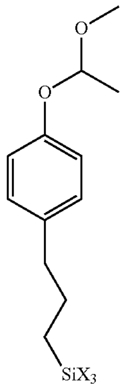

-continued

Formula (B-28)

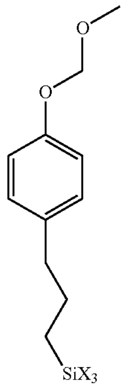

Formula (B-29)

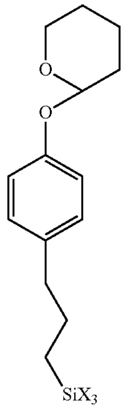

Formula (B-30)

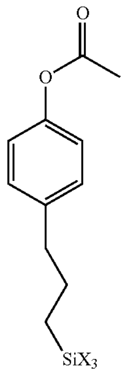

Formula (B-31)

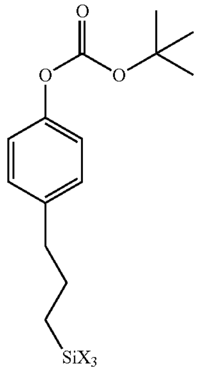

-continued

Formula (B-32)

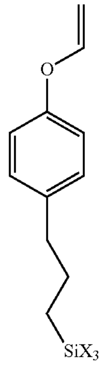

Examples of the silicon-containing compound of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis-condensation product of the hydrolyzable organosilane of Formula (1) and the silicon-containing compound of Formula (3) include polymers containing any of unit structures of Formulae (C-1) to (C-6).

Formula (C-1)

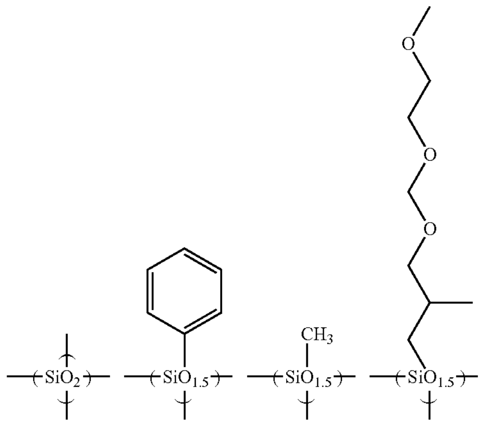

Formula (C-2)

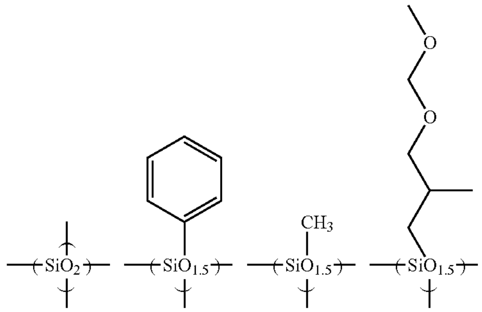

-continued

Formula (C-3)

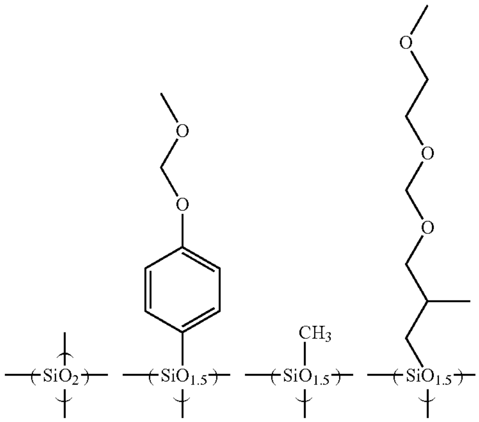

Formula (C-4)

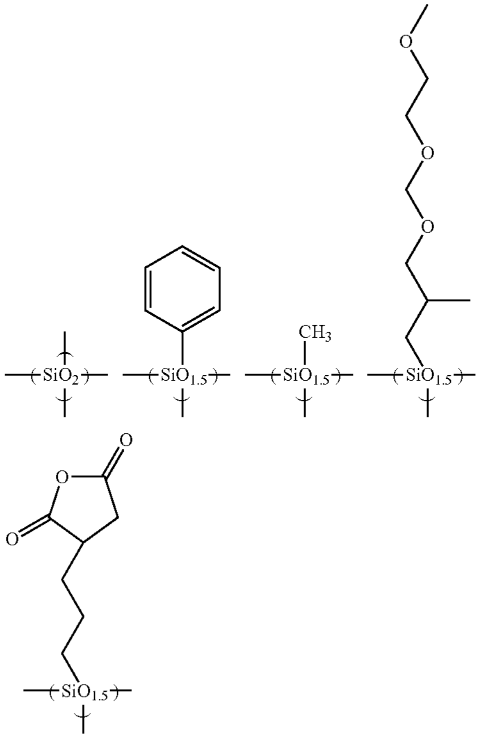

Formula (C-5)

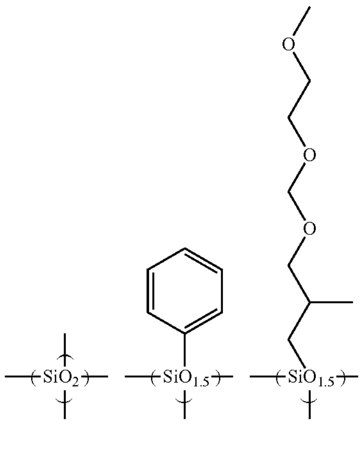

-continued

Formula (C-6)

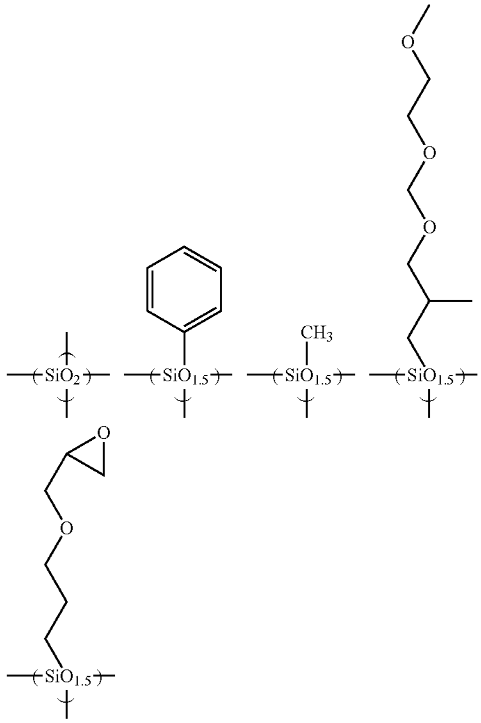

The hydrolysis-condensation product (polyorganosiloxane) of the hydrolyzable organosilane of Formula (1) or the hydrolysis-condensation product (polyorganosiloxane) of the hydrolyzable organosilane of Formula (1) and the silicon-containing compound of Formula (3) and/or Formula (4) preferably has a weight average molecular weight of 1,000 to 1,000,000 or 1,000 to 100,000.

The molecular weight of such a hydrolysis-condensation product is a molecular weight obtained by GPC analysis in terms of polystyrene, and GPC analysis can be carried out in a condition, for example, using a GPC apparatus (trade name: HLC-8220 GPC, manufactured by Tosoh Corporation), a GPC column (trade name: Shodex KF803L, KF802, or KF801, manufactured by Showa Denko K. K.), at a column temperature of 40° C., using tetrahydrofuran as an eluent (elution solvent), at a flow rate (flow speed) of 1.0 mL/min, and using polystyrene (manufactured by Showa Denko K. K.) as a standard sample.

In order to obtain the hydrolysis-condensation product of the hydrolyzable organosilane of Formula (1) or the hydrolysis-condensation product of the hydrolyzable organosilane of Formula (1) and the silicon-containing compound of Formula (3) and/or Formula (4), hydrolysis is carried out in an organic solvent using water in an amount of 0.5 to 100 mol, preferably 1 to 10 mol, based on 1 mol of the total amount elan alkoxysilyl group, an acyloxysilyl group, and a halogenated silyl group as the hydrolyzable groups (an $R^3$—Si— group, an $R^7$—Si— group, and an $R^9$—Si— group) in the organosilane and the silicon-containing compounds. A hydrolysis catalyst may be used in an amount of 0.001 to 10 mol, preferably 0.001 to 1 mol, based on 1 mol of the hydrolyzable group.

The hydrolysis and condensation is commonly carried out at a reaction temperature of 20 to 80° C.

The hydrolysis may be completely carried out or may be partially carried out. In other words, a hydrolysate and a monomer may remain in the hydrolysis-condensation product as described above.

After the hydrolysis and condensation, distillation under reduced pressure of the obtained hydrolysis-condensation product (polymer) enables alcohols that are by-products, a hydrolysis catalyst, and water to be simultaneously removed. An acid or base catalyst used in the hydrolysis can be removed by neutralization or ion exchange.

As the hydrolysis catalyst, a metal chelate compound, an organic acid, an inorganic acid, an organic base, and an inorganic base can be exemplified.

Examples of the metal chelate compound as the hydrolysis catalyst include titanium chelate compounds such as triethoxy-mono(acetylacetonate)titanium, tri-n-propoxy-mono(acetylacetonate)titanium, tri-i-propoxy-mono(acetylacetonate)titanium, tri-n-butoxy-mono(acetylacetonate)titanium, tri-sec-butoxy-mono(acetylacetonate)titanium, tri-i-butoxy-mono(acetylacetonate)titanium, diethoxy-bis(acetylacetonate)titanium, di-n-propoxy-bis(acetylacetonate)titanium, di-i-propoxy-bis(acetylacetonate)titanium, di-n-butoxy-bis(acetylacetonate)titanium, di-sec-butoxy-bis(acetylacetonate)titanium, di-t-butoxy-bis(acetylacetonate)titanium, monoethoxy-tris(acetylacetonate)titanium, mono-n-propoxy-tris(acetylacetonate)titanium, mono-i-propoxy-tris(acetylacetonate)titanium, mono-n-butoxy-tris(acetylacetonate)titanium, mono-sec-butoxy-tris(acetylacetonate)titanium, mono-t-butoxy-tris(acetylacetonate)titanium, tetrakis(acetylacetonate)titanium, triethoxy-mono(ethyl acetoacetate)titanium, tri-n-propoxy-mono(ethyl acetoacetate)titanium, tri-i-propoxy-mono(ethyl acetoacetate)titanium, tri-n-butoxy-mono(ethyl acetoacetate)titanium, tri-sec-butoxy-mono(ethyl acetoacetate)titanium, tri-t-butoxy-mono(ethyl acetoacetate)titanium, diethoxy-bis(ethyl acetoacetate)titanium, di-n-propoxy-bis(ethyl acetoacetate)titanium, di-i-propoxy-bis(ethyl acetoacetate)titanium, din-butoxy-bis(ethyl acetoacetate)titanium, di-sec-butoxy-bis(ethyl acetoacetate)titanium, di-t-butoxy-bis(ethyl acetoacetate)titanium, monoethoxy-tris(ethyl acetoacetate)titanium, mono-n-propoxy-tris(ethyl acetoacetate)titanium, mono-i-propoxy-tris(ethyl acetoacetate)titanium, mono-n-butoxy-tris(ethyl acetoacetate)titanium, mono-sec-butoxy-tris(ethyl acetoacetate)titanium, mono-t-butoxy-tris(ethylacetoacetate)titanium, tetrakis(ethyl acetoacetate)titanium, mono(acetylacetonate)tris(ethyl acetoacetate)titanium, bis(acetylacetonate)bis(ethyl acetoacetate)titanium, and tris(acetylacetonate)mono(ethyl acetoacetate)titanium; zirconium chelate compounds such as triethoxy-mono(acetylacetonate)zirconium, tri-n-propoxy-mono(acetylacetonate)zirconium, tri-i-propoxy-mono(acetylacetonate)zirconium, tri-n-butoxy-mono(acetylacetonate)zirconium, tri-sec-butoxy-mono(acetylacetonate)zirconium, tri-t-butoxy-mono(acetylacetonate)zirconium, diethoxy-bis(acetylacetonate)zirconium, di-n-propoxy-bis(acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonato)zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris(acetylacetonate)zirconium, tetrakis(acetylacetonate)zirconium, triethoxy-mono(ethyl acetoacetate)zirconium, tri-n-propoxy-mono(ethyl acetoacetate)zirconium, tri-i-propoxy-mono(ethyl acetoacetate)zirconium, tri-n-butoxy-mono(ethyl acetoacetate)zirconium, tri-sec-butoxy-mono(ethyl acetoacetate)zirconium, tri-t-butoxy-mono(ethyl acetoacetate)zirconium, diethoxy-bis(ethyl acetoacetate)zirconium, di-n-propoxy-bis(ethyl acetoacetate)zirconium, di-i-propoxy-bis(ethyl acetoacetate)zirconium, di-n-butoxy-bis(ethyl acetoacetate)zirconium, di-sec-butoxy-bis(ethyl acetoacetate)zirconium, di-i-butoxy-bis(ethyl acetoacetate)zirconium, monoethoxy-tris(ethyl acetoacetate)zirconium, mono-n-propoxy-tris(ethyl acetoacetate)zirconium, mono-i-propoxy-tris(ethyl acetoacetate)zirconium, mono-n-butoxy-tris(ethyl acetoacetate)zirconium, mono-sec-butoxy-tris(ethyl acetoacetate)zirconium, mono-t-butoxy-tris(ethyl acetoacetate)zirconium, tetrakis(ethyl acetoacetate)zirconium, mono(acetylacetonate)tris(ethyl acetoacetate)zirconium, bis(acetylacetonate)bis(ethyl acetoacetate)zirconium, and tris(acetylacetonate)mono(ethyl acetoacetate)zirconium; and aluminum chelate compounds such as tris(acetylacetonate)aluminum and tris(ethyl acetoacetate)aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide.

Examples of the inorganic base include ammonia, sodium hydroxide, potassium hydroxide, barium hydroxide, and calcium hydroxide.

Among these hydrolysis catalysts, metal dilate compounds, organic acids, and inorganic acids are preferred and these compounds may be used singly or as a mixture of two or more of them.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, and n-amylnaphthalene; monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonylalcohol, 2,6-dimethyl-4-heptanol, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-1-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monoethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; Nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propane sultone. These solvents may be used singly or in combination of two or more of them.

Among them, ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-1-butyl ketone, trimethylnonanone, cyclohexanone, methylcyclohexanone, 2,4-pentanedione, acetonylacetone, diacetone alcohol, acetophenone, and fenchone are particularly preferred from the viewpoint of the storage stability of a solution.

[Solvent]

As the solvent used in the composition for forming a resist underlayer film of the present invention, any solvents can be used without particular limitation as long as the organosilane component and other components such as a curing catalyst described later can be dissolved. Examples of such a solvent include methyl cellosolve acetate, ethyl cellosolve acetate, propylene glycol, propylene glycol monomethyl ether, propylene glycol monoethyl ether, methylisobutylcarbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, methyl 3-methoxy-2-methylpropionate, methyl 2-hydroxy-3-methylbutyrate, ethyl methoxyacetate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methylpyrrolidone, and γ-butyrolactone. These solvents may be used singly or in combination of two or more of them.

[Curing Catalyst]

The composition for forming a resist underlayer film of the present invention may further include a curing catalyst. The curing catalyst has the function of accelerating curing when a coating film including a polyorganosiloxane of a hydrolysis-condensation product is heated to be cured.

Usable examples of the curing catalyst include ammonium salts, phosphines, phosphonium salts, and sulfonium salts.

As the ammonium salt, quaternary ammonium salts of Formula (D-1) to Formula (D-5) and tertiary ammonium salts of Formula (D-6) can be exemplified, Formula (D-1)

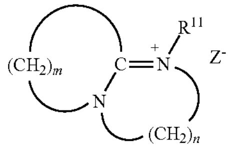

(where m is an integer of 2 to 11, n is an integer of 2 to 3, $R^{11}$ is an alkyl group or an aryl group, and $Z^-$ is an anion.)

$R^{12}R^{13}R^{14}R^{15}N^+Z^-$ Formula (D-2)

(where each of $R^{12}$, $R^{13}$, $R^{14}$, and $R^{15}$ is independently an alkyl group or an aryl group, N is a nitrogen atom, $Z^-$ is an anion, and each of $R^{12}$, $R^{13}$, $R^{14}$, and $R^{15}$ is bonded to the nitrogen atom in Formula through a C—N bond.)

Formula (D-3)

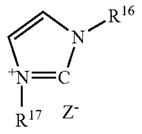

(where each of $R^{16}$ and $R^{17}$ is independently an alkyl group or an aryl group, and $Z^-$ is an anion.)

Formula (D-4)

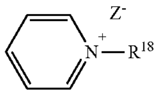

(where $R^{18}$ is an alkyl group or an aryl group, and $Z^-$ is an anion.)

Formula (D-5)

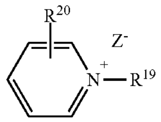

(where each of $R^{19}$ and $R^{20}$ is independently an alkyl group or an aryl group, and $Z^-$ is an anion.)

Formula (D-6)

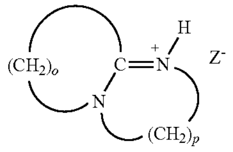

(where o is an integer of 2 to 11, p is an integer of 2 to 3, H is a hydrogen atom, and $Z^-$ is an anion.)

As the phosphonium salt, quaternary phosphonium salts of Formula (D-7) can be exemplified.

$R^{21}R^{22}R^{23}R^{24}P^+Z^-$ Formula (D-7)

(where each of $R^{21}$, $R^{22}$, $R^{23}$, and $R^{24}$ is independently an alkyl group or an aryl group, P is a phosphorus atom, $Z^-$ is an anion, and each of $R^{21}$, $R^{22}$, $R^{23}$ and $R^{24}$ is bonded to the phosphorus atom in Formula through a C—P bond.)

As the sulfonium salt, tertiary sulfonium salts of Formula (D-8) can be exemplified.

$R^{25}R^{26}R^{27}S^+Z^-$ Formula (D-8)

(where each of $R^{25}$, $R^{26}$, and $R^{27}$ is independently an alkyl group or an aryl group, S is a sulfur atom, $Z^-$ is an anion, and each of $R^{25}$, $R^{26}$, and $R^{27}$ is bonded to the sulfur atom in Formula through a C—S bond.)

The compound of Formula (D-1) is a quaternary ammonium salt derived from an amine. In Formula, $R^{11}$ is a $C_{1-18}$, preferably $C_{2-10}$ alkyl group or an aryl group. Examples of the group include linear alkyl groups such as an ethyl group, a propyl group, and a butyl group, branched alkyl groups such as a cyclohexyl group and a cyclohexylmethyl group, aryl groups such as a benzyl group, and a dicyclopentadienyl group.

Examples of the anion ($Z^-$) include halogen ions such as a chloride ion ($Cl^-$), a bromide ion ($Br^-$), and an iodide ion ($I^-$) and ions including anionic groups such as carboxylate ($—COO^-$), sulfonate ($—SO^-$), and alcoholate ($—O^-$).

The compound of Formula (D-2) is a quaternary ammonium salt derived from an amine. In Formula, each of $R^{12}$, $R^{13}$, $R^{14}$, and $R^{15}$ is independently a $C_{1-18}$ alkyl group, an aryl group, or a silane compound bonded to a silicon atom through a Si—C bond.

Specific examples of the alkyl group, the aryl group, and the anion ($Z^-$) include those exemplified in Formula (D-1).

The quaternary ammonium salts of Formula (D-2) are commercially available, and examples include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from a 1-substituted imidazole. In Formula, each of $R^{16}$ and $R^{17}$ is independently a $C_{1-18}$ organic group and the total number of carbon atoms of $R^{16}$ and $R^{17}$ is preferably 7 or more. Examples of $R^{16}$ include a methyl group, an ethyl group, a propyl group, a phenyl group, and a benzyl group, and examples of $R^{17}$ include a benzyl group, an octyl group, and an octadecyl group.

Specific examples of the anion (2) include those exemplified in Formula (D-1).

The compound of Formula (D-3) is also commercially available or can be produced by, for example, reaction of an imidazole compound such as 1-methylimidazole and 1-benzylimidazole and a halogenated alkyl or a halogenated aryl such as benzyl bromide and methyl bromide.

The compound of Formula (D-4) is a quaternary ammonium salt derived from pyridine. In Formula, $R^{18}$ is a $C_{1-18}$, preferably $C_{4-18}$ alkyl group or an aryl group. Examples of the group include a butyl group, an octyl group, a benzyl group, and a lauryl group.

Specific examples of the anion ($Z^-$) include those exemplified in Formula (D-1).

The compound of Formula (D-4) is also commercially available or can be produced by, for example, reaction of pyridine and a halogenated alkyl or a halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (D-5) is a quaternary ammonium salt derived from a substituted pyridine such as picoline (methylpyridine), for example.

In Formula, $R^{19}$ is a $C_{1-18}$, preferably $C_{4-18}$ alkyl group or an aryl group, and examples include a methyl group, an octyl group, a lauryl group, and a benzyl group. $R^{20}$ is a $C_{1-18}$ alkyl group or an aryl group, and for example, a quaternary ammonium derived from picoline has a methyl group as $R^{20}$.

Specific examples of the anion (Z) include those exemplified in Formula (D-1).

The compound of Formula (D-5) is also commercially available or can be produced by, for example, reaction of a substituted pyridine such as picoline and a halogenated alkyl or a halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (D-6) is a tertiary ammonium salt derived from an amine. Specific examples of the anion (1) in Formula include those exemplified in Formula (D-1).

The compound of Formula (D-6) can be produced by, for example, reaction of an amine and a weak acid such as a carboxylic acid and phenol.

Examples of the carboxylic acid include formic acid and acetic acid. When formic acid is used, the anion ($Z^-$) is ($HCOO^-$), whereas when acetic acid is used, the anion ($Z^-$) is ($CH_3COO^-$). When phenol is used, the anion ($Z^-$) is ($C_6H_5O^-$).

In the compound of Formula (D-7), $R^{21}$, $R^{22}$, $R^{23}$, and $R^{24}$ in Formula are a $C_{1-18}$ alkyl group, an aryl group, or a silane compound bonded to a silicon atom through a Si—C bond.

Preferably, three of four groups of $R^{21}$ to $R^{24}$ are a phenyl group or a substituted phenyl group, and examples include a phenyl group and a tolyl group. The remaining one group is a $C_{1-18}$ alkyl group, an aryl group, or a silane compound bonded to a silicon atom through a Si—C bond.

Specific examples of the anion ($Z^-$) include those exemplified in Formula (D-1).

The compound of Formula (D-7) is commercially available. Examples of the compound include halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tetraphenylphosphonium; halogenated tritolylmonoarylphosphoniums such as a halogenated tritolylmonophenylphosphonium; and halogenated tritolylmonoalkylphosphoniums such as a halogenated tritolylmonomethylphosphonium (each halogen atom is a chlorine atom or a bromine atom). Halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tritolylmonoarylphosphoniums such as a halogenated tritolylmonophenylphosphonium; and halogenated tritolylmonoalkylphosphoniums such as a halogenated tritolylmonomethylphosphonium (each halogen atom is a chlorine atom or a bromine atom in the above) are particularly preferred.

Examples of the phosphines include primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

In the compound of Formula (D-8), each of $R^{25}$, $R^{26}$, and $R^{27}$ in Formula is independently a $C_{1-18}$ alkyl group or an aryl group. Preferably, two of three groups of $R^{25}$ to $R^{27}$ are a phenyl group or a substituted phenyl group, and examples include a phenyl group and a tolyl group. The remaining one group is a $C_{1-18}$ alkyl group or an aryl group.

Specific examples of the anion ($Z^-$) include those exemplified in Formula (D-1).

The compound of Formula (D-8) is commercially available. Examples of the compound include halogenated trialkylsulfoniums such as a halogenated tri-n-butylsulfonium and a halogenated tri-n-propylsulfonium; halogenated dialkylbenzylsulfoniums such as a halogenated diethylbenzylsulfonium; halogenated diphenylmonoalkylsulfoniums such as a halogenated diphenylmethylsulfonium and a halogenated diphenylethylsulfonium; a halogenated triphenylsulfonium (each halogen atom is a chlorine atom or a bromine atom in the above); trialkylphosphonium carboxylates such as tri-n-butylsulfonium carboxylate and tri-n-propylsulfonium carboxylate; diallylbenzylsulfonium carboxylates such as diethylbenzylsulfonium carboxylate; diphenylmonoalkylsulfonium carboxylates such as diphenylmethylsulfonium carboxylate and diphenylethylsulfonium carboxylate; and triphenylsulfonium carboxylate. A halogenated triphenylsulfonium and triphenylsulfonium carboxylate are particularly preferred.

When such a curing catalyst is included, the amount is 0.01 to 10 parts by mass, 0.01 to 5 parts by mass, or 0.01 to 3 parts by mass, based on 100 parts by mass of the polyorganosiloxane of the hydrolysis-condensation product.

<Stabilizer Such as Organic Acid>

The composition for forming a lithography resist underlayer film of the present invention may include an organic acid, water, an alcohol, or a combination of two or more of them for stabilization of the composition.

Examples of the organic acid include oxalic acid, malonic acid, methylmalonic acid, succinic acid, maleic acid, malic acid, tartaric acid, phthalic acid, citric acid, glutaric acid, lactic acid, and salicylic acid. Among them, for example, oxalic acid and maleic acid are preferred. When an organic acid is added, the amount is 0.1 to 5.0 parts by mass based on 100 parts by mass of the hydrolysis-condensation product (polyorganosiloxane).

Usable examples of the water to be added include pure water, ultrapure water, and km-exchanged water, and the amount is 1 to 20 parts by mass based on 100 parts by mass of the composition for forming a resist underlayer film.

Preferred alcohols to be added are those that are readily volatilized by heat after coating, and example of such an alcohol include methanol, ethanol, propanol, isopropanol, and butanol. The amount is 1 to 20 parts by mass based on 100 parts by mass of the composition for forming a resist underlayer film.

<Bisphenol S>

The composition for forming an underlayer film of the present invention may include a bisphenol S in order to improve storage stability. As such a bisphenol S, compounds of Formulae (E-1) to (E-23) can be exemplified.

Formula (E-1)

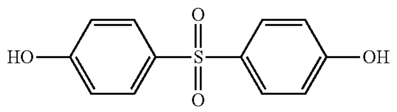

-continued
Formula (E-2)
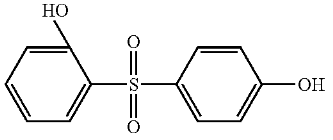
Formula (E-3)
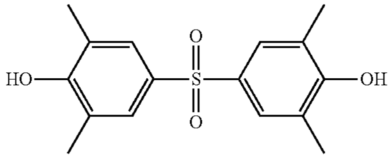
Formula (E-4)
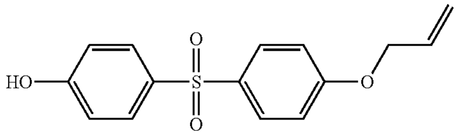
Formula (E-5)
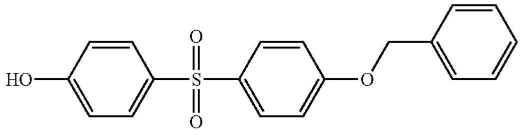
Formula (E-6)
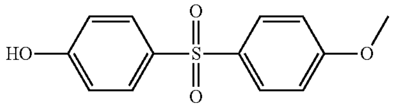
Formula (E-7)
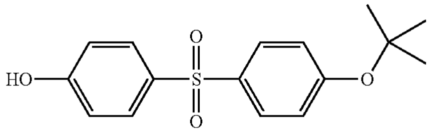
Formula (E-8)
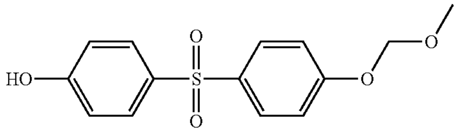
Formula (E-9)
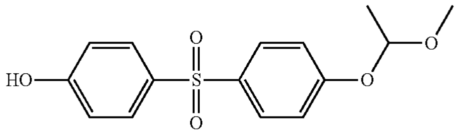
Formula (E-10)
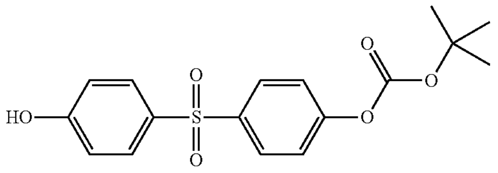
Formula (E-11)
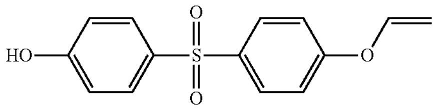
-continued
Formula (E-12)
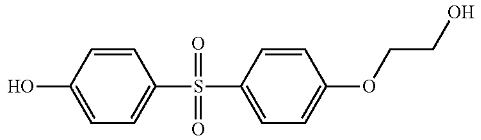
Formula (E-13)
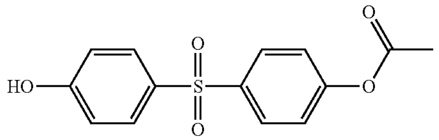
Formula (E-14)
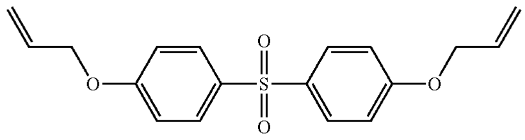
Formula (E-15)
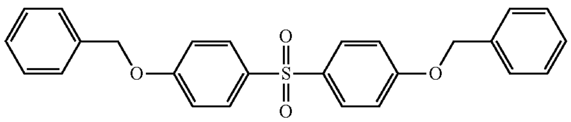
Formula (E-16)
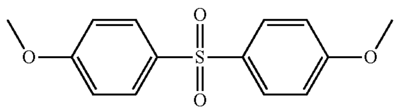
Formula (E-17)
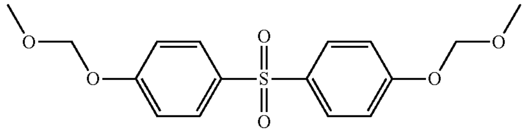
Formula (E-18)
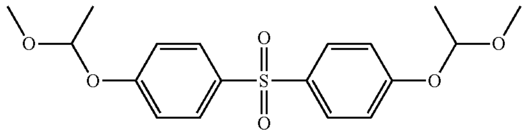
Formula (E-19)
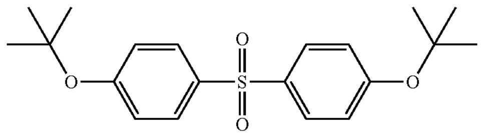
Formula (E-20)
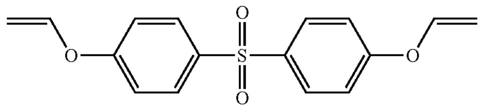
Formula (E-21)
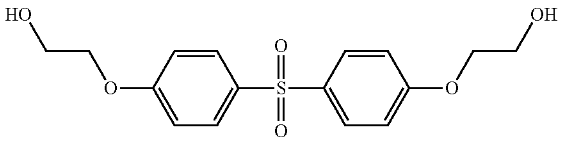

-continued

Formula (E-22)

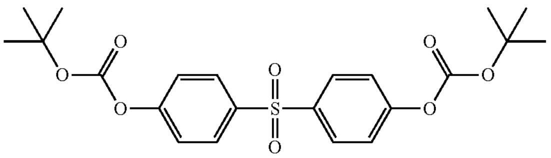

Formula (E-23)

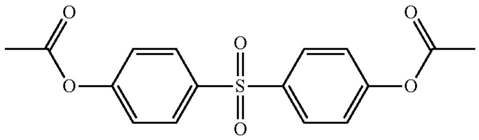

The bisphenol S can be compounded in a ratio of 0.01 to 30 parts by mass based on 100 parts by mass of the polyorganosiloxane of the hydrolysis-condensation product.

The composition for forming a lithography underlayer film of the present invention may include an organic polymer compound, a photo acid generator, a surfactant, and other components in addition to the components above as necessary.

<Organic Polymer Compound>

By using an organic polymer compound, the dry etching rate (the reduction amount of a film thickness per unit time), the attenuation coefficient, the refractive index, and other properties of a resist underlayer film formed from the composition for forming a lithography underlayer film of the present invention can be controlled.

An organic polymer compound having a hydroxyl group can form a cross-linkage between the hydroxyl group and the polyorganosiloxane.

The organic polymer compound is not particularly limited and various organic polymers can be used. Examples of the organic polymer include addition polymers and polycondensation polymers such as polyester, polystyrene, polyimide, acrylic polymer, methacrylic polymer, polyvinyl ether, phenol novolac, naphthol novolac, polyether, polyamide, and polycarbonate.

An addition polymer used as the organic polymer compound may be a homopolymer or a copolymer. For the production of the addition polymer, an addition polymerizable monomer is used. Examples of such an addition polymerizable monomer include acrylic acid, methacrylic acid, an acrylic ester compound, a methacrylic ester compound, an acrylamide compound, a methacrylamide compound, a vinyl compound, a styrene compound, a maleimide compound, maleic anhydride, and acrylonitrile.

Examples of the acrylic ester compound include methyl acrylate, ethyl acrylate, n-hexyl acrylate, isopropyl acrylate, cyclohexyl acrylate, benzyl acrylate, phenyl acrylate, naphthyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic ester compound include methyl methacrylate, ethyl methacrylate, n-hexyl methacrylate, isopropyl methacrylate, cyclohexyl methacrylate, benzyl methacrylate, phenyl methacrylate, anthryl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinylmethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

Examples of the polycondensation polymer used as the polymer include a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride.

Examples of the polycondensation polymer include polyesters, polyamides, and polyimides such as polypyromellitimide, poly(p-phenylene terephthalamide), polybutylene terephthalate, and polyethylene terephthalate; phenol novolac; and naphthol novolac.

Among them, an organic polymer including an aromatic ring structure having a function as a light absorbing moiety, such as a benzene ring, a naphthalene ring, an anthracene ring, a triazine ring, a quinoline ring, and a quinoxaline ring is preferably used.

Examples of such an organic polymer compound include addition polymers containing, as the structural unit, addition polymerizable monomers such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and polycondensation polymers such as phenol novolac and naphthol novolac.

A polymer compound usable as the organic polymer compound has a weight average molecular weight of, for example, 1,000 to 1,000,000, 3,000 to 300,000, 5,000 to 200,000, or 10,000 to 100,000.

These organic polymer compounds may be used singly or in combination of two or more of them.

When the organic polymer compound is used, the ratio is 1 to 200 parts by mass, 5 to 100 parts by mass, 10 to 50 parts by mass, or 20 to 30 parts by mass, based on 100 parts by mass of the hydrolysis-condensation product (polyorganosiloxane).

<Photo Acid Generator>

The composition for forming a resist underlayer film of the present invention may include an acid generator. As the acid generator, a thermal acid generator and a photo acid generator can be exemplified, and a photo acid generator is preferred in the present invention.

The photo acid generator generates an acid during the exposure of a resist, and this enables adjustment of the acidity of the underlayer film. In other words, the addition of the photo acid generator is one method for matching the acidity of the underlayer film to the acidity of the upper resist. The adjustment of the acidity of the underlayer film enables the adjustment of the pattern shape of the resist formed on the underlayer film.

As the photo acid generator included in the composition for forming a resist underlayer film of the present invention, an onium salt compound, a sulfonimide compound, and a disulfonyl diazomethane compound can be exemplified.

Examples of the onium salt compound include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-n-butanesulfonyloxy)succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo acid generators may be used singly or in combination of two or more of them.

When the photo acid generator is used, the ratio is 0.01 to 5 parts by mass, 0.1 to 3 parts by mass, or 0.5 to 1 part by mass, based on 100 parts by mass of the hydrolysis-condensation product (polyorganosiloxane).

<Surfactant>

A surfactant has a beneficial effect on suppression of pinholes, striations, and other defects generated during the application of the composition for forming a lithography resist underlayer film of the present invention onto a substrate.

Examples of the surfactant included in the composition for forming a resist underlayer film of the present invention include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants including trade name EFTOP EF301, EF303, and EF352 (manufactured by Tochem Products (at present: Mitsubishi Materials Electronic Chemicals Co., Ltd.), trade name MEGAFAC F171, F173, R-08, and R-30 (manufactured by DIC Corporation), Fluorad FC430 and FC431 (manufactured by Sumitomo 3M Limited), and trade name Asahiguard AG710, Surflon S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.).

These surfactants may be used singly or in combination of two or more of them.

When the surfactant is used, the ratio is 0.0001 to 5 parts by mass, 0.001 to 1 part by mass, or 0.01 to 0.5 part by mass, based on 100 parts by mass of the hydrolysis-condensation product (polyorganosiloxane).

The composition for forming a resist underlayer film of the present invention may include a rheology control agent, an adhesion assistant, and other additives. The rheology control agent has a beneficial effect on the improvement of flowability of the composition for forming an underlayer film. The adhesion assistant has a beneficial effect on the improvement of adhesion between a semiconductor substrate or a resist and the underlayer film.

[Method for Producing Semiconductor Device]

A method for producing a semiconductor device using the composition for forming a resist underlayer film of the present invention includes applying the composition for forming a resist underlayer film of the present invention onto a semiconductor substrate and baking the composition to form a resist underlayer film, applying a resist composition onto the underlayer film to form a resist film, exposing the resist film to light and developing the resist after exposure with a solvent to afford a resist pattern, etching the resist underlayer film based on the resist pattern, and fabricating the semiconductor substrate based on the patterned resist and the resist underlayer film.

The present invention also covers the method for producing a semiconductor device using the composition for forming a resist underlayer film of the present invention. The method will be specifically described below along each process.

Examples of the substrate used in the production of a semiconductor device include a silicon wafer substrate, a silicon/silicon dioxide-coated substrate, a silicon nitride substrate, a glass substrate, an ITO substrate, a polyimide substrate, and a low dielectric constant material- (low-k material-) coated substrate.

Onto the substrate, the composition for forming a resist underlayer film of the present invention is applied with an appropriate coating method such as a spinner and a coater, followed by baking, and a resist underlayer film is formed.

The baking condition is appropriately selected from a baking temperature of 80° C. to 250° C. and a baking time of 0.3 to 60 minutes. Preferably, the baking temperature is 150° C. to 250° C. and the baking time is 0.5 to 2 minutes.

The underlayer film formed has a film thickness of, for example, 10 to 1,000 ram, 20 to 500 nm, 50 to 300 nm, or 100 to 200 nm.

Next, on the underlayer film, a resist layer such as a photoresist is formed. The resist layer can be formed by a well-known method, that is, by applying a resist composition solution onto the underlayer film followed by baking.

The resist layer has a film thickness of, for example, 50 to 10,000 nm, 100 to 2,000 nm, or 200 to 1,000 nm.

The photoresist formed on the resist underlayer film of the present invention is not particularly limited as long as it is photosensitive and is used for the exposure. The photoresist may be negative or positive. Any photoresist can be used as long as it can be developed with a solvent after exposure to light. Examples of the photoresist include trade name AR2772JN manufactured by JSR Corporation and trade name FAiRS-9521NT05 manufactured by Fujifilm Corporation.

In the present invention, a resist for electron beam lithography can be used as the resist in place of a photoresist. The electron beam resist may be negative or positive, and any electron beam resist can be used as long as it can be developed with a solvent after exposure to light.

Next, exposure to light is carried out through a predetermined mask. For the exposure, a KrF excimer laser (having a wavelength of 248 nm), an ArF excimer laser (having a wavelength of 193 nm), and F2 excimer laser (having a wavelength of 157 nm) can be used, for example. After the exposure, post exposure bake may also be carried out as necessary. The post exposure bake is carried out in a condition appropriately selected from a heating temperature of 70° C. to 150° C. and a heating time of 0.3 to 10 minutes.

In the case of using the electron beam resist described above, the use of an electron beam as the irradiation source enables a resist pattern to be formed in a similar manner to that in the case of using a photoresist.

Then, development is carried out with a developer (solvent). By the development, for example, a resist in an area without exposure to light is removed to form a resist pattern when a positive resist is used.

Examples of the developer include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Such a developer may further contain, for example, a surfactant. The development condition can be appropriately selected from a temperature of 5 to 50° C. and a time of 10 to 600 seconds.

Then, using the photoresist pattern formed above as a protective film, the underlayer film formed using the composition of the present invention is etched (removed). Next, using a film including the patterned photoresist and the underlayer film as a protective film, the semiconductor substrate is fabricated.

First, an underlayer film in an area where the photoresist is removed is removed by dry etching so that the semiconductor substrate is bared.

For dry etching of the underlayer film formed using the composition of the present invention, gases such as tetrafluoromethane ($CF_4$), perfluorocyclobutane ($C_4F_8$), perfluoropropane ($C_3F_8$), trifluoromethane ($CHCF_3$), difluoromethane ($CH_2F_2$), carbon monoxide, argon, oxygen, nitrogen, sulfur hexafluoride, difluoromethane, nitrogen trifluoride, chlorine trifluoride, chlorine, trichloroborane, and dichloroborane can be used.

Basically, dry etching with a halogen-containing gas is unlikely to remove a photoresist containing an organic substance and can immediately remove an underlayer film containing a large number of silicon atoms. Hence, in the dry etching of an underlayer film formed using the composition of the present invention, a halogen-containing gas is preferably used. This can suppress the reduction in film thickness of the photoresist due to the dry etching of the underlayer film, and as a result, a photoresist having a small film thickness can be used.

For the dry etching of an underlayer film formed using the composition of the present invention, a fluorine-containing gas is particularly preferably used, and examples of the gas include tetrafluoromethane ($CF_4$), perfluorocyclobutane ($C_4F_8$), perfluoropropane ($C_3F_8$), trifluoromethane ($CHCF_3$), and difluoromethane ($CH_2F_2$) described above.

Then, using the film including the patterned photoresist and the patterned underlayer film formed using the composition of the present invention as a protective film, the semiconductor substrate is fabricated. The semiconductor substrate is preferably fabricated by dry etching with a fluorine-containing gas.

Examples of the fluorine-containing gas include tetrafluoromethane ($CF_4$), perfluorocyclobutane ($C_4F_8$), perfluoropropane ($C_3F_8$), trifluoromethane ($CHCF_3$), and difluoromethane ($CH_2F_2$).

In the present invention, after the formation of an organic underlayer film on a substrate, the resist underlayer film of the present invention may be formed on the organic underlayer film, and a photoresist may be applied onto the resist underlayer film.

In other words, another method for producing a semiconductor device of the present invention include forming an organic underlayer film on a semiconductor substrate, applying the composition for forming a resist underlayer film of the present invention onto the organic underlayer film and baking the composition to form a resist underlayer film, applying a resist composition onto the resist underlayer film to form a resist layer, exposing the resist film to light, developing the resist after exposure with a solvent to afford a resist pattern, etching the resist underlayer film based on the resist pattern, etching the organic underlayer film based on the patterned resist underlayer film, and fabricating the semiconductor substrate based on the patterned organic underlayer film.

The organic underlayer film can be formed using a similar procedure to those for the underlayer film and the resist film.

For the etching of the organic underlayer film, considering that an underlayer film formed using the composition of the present invention and containing a large number of silicon atoms is unlikely to be removed by dry etching with an oxygen-containing gas, the organic underlayer film is preferably dry etched with an oxygen-containing gas.

Finally, using the patterned photoresist, underlayer film, and organic underlayer film as protective films, the semiconductor substrate is fabricated.

In the present invention, the formation of an organic underlayer film on a substrate enables a photoresist to have a small pattern width. Hence, even when a photoresist has a small thickness for suppressing pattern falling, appropriate selection of the etching gas enables the fabrication of a substrate.

In other words, for an underlayer film formed using the composition of the present invention, a fluorine-containing gas that has a sufficiently high etching rate with respect to a photoresist is used as the etching gas; for an organic underlayer film, an oxygen-containing gas that has a sufficiently high etching rate with respect to the underlayer film formed using the composition of the present invention is used as the etching gas; and for a substrate, a fluorine-containing gas that has a sufficiently high etching rate with respect to the organic underlayer film is used as the etching gas. Such selection enables each of the underlayer film, the organic underlayer film, and the substrate to be selectively fabricated.

As an upper layer of the underlayer film formed using the composition of the present invention, an organic anti-reflective coating can be formed before the formation of a photoresist. The composition for forming an anti-reflective coating used is not particularly limited, and any composition may be selected from those conventionally used in a lithography process. The anti-reflective coating can be formed by a conventional manner, for example, coating with a spinner or a coater and baking.

A substrate to be coated with the composition for forming an underlayer film of the present invention may have a surface with an organic or inorganic anti-reflective coating formed by CVD method or other methods, and the underlayer film of the present invention may be formed on the anti-reflective coating.

A resist underlayer film formed from the composition for forming a resist underlayer film of the present invention may absorb light used in a lithography process depending on a wavelength of the light. On this account, in such a case, the resist underlayer film can serve as the anti-reflective coating having an effect to suppress reflected light from a substrate.

The underlayer film of the present invention can be used as, for example, a layer for suppressing the interaction between a substrate and a photoresist, a layer having a function to prevent a substrate from adverse effects of a material used in a photoresist or a substance generated during the exposure of a photoresist, a layer having a function to prevent a substance generated from a substrate during heating and baking from diffusion into an overcoated photoresist, and a barrier layer for reducing a poisoning effect on a photoresist layer due to a semiconductor substrate dielectric layer.

A resist underlayer film formed from the composition for forming a resist underlayer film of the present invention can be applied to a substrate with via holes used in a dual damascene process and can be used as a burying material capable of thoroughly filling the holes. The resist underlayer film can also be used as a planarization material for planarizing an uneven surface of a semiconductor substrate.

EXAMPLES

The present invention will be described more specifically with reference to examples below, but the present invention is not limited to them.

Material Synthesis Example 1

Synthesis of Hydrolyzable Organosilane (1)

Into a 200-ml flask, 8.01 g (50% by mol) of 2-methyl-4,9,6-trioxa-1-decene, 0.026 g (0.05% by mol) of hexachloroplatinic(IV) acid hydrate, and 100 g of tetrahydrofuran were charged. Into the mixed solution, 7.94 g (65% by mol) of trimethoxysilane was added dropwise under a nitrogen stream with stirring with a magnetic stirrer. After the addition, the mixture was reacted at ambient temperature for 24 hours. Then, the reaction mixture was distilled to afford 8.47 g of (3-((2-methoxyethoxy)methoxy)-2-methylpropyl)trimethoxysilane (corresponding to the compound of Formula (A-29)).

Material Synthesis Example 2

Synthesis of Hydrolyzable Organosilane (2)

Into a 200-ml flask, 5.81 g (50% by mol) of 2-methyl-4,6-dioxa-1-heptene, 0.026 g (0.05% by mol) of hexachloroplatinic(IV) acid hydrate, and 100 g of tetrahydrofuran were charged. Into the mixed solution, 10.68 g (65% by mol) of triethoxysilane was added dropwise under a nitrogen stream with stirring with a magnetic stirrer. After the addition, the mixture was reacted at ambient temperature for 24 hours. Then, the reaction mixture was distilled to afford 5.60 g of (3-(methoxymethoxy)-2-methylpropyl)triethoxysilane (corresponding to the compound of Formula (A-23)).

Synthesis Example 1

Into a 200-ml flask, 14.58 g (70% by mol in the total slime compounds, the same meaning is applied hereinafter) of tetraethoxysilane, 3.57 g (20% by mol) of methyltriethoxysilane, 0.99 g (5% by mol) of phenyltrimethoxysilane, 1.41 g (5% by mol) of (3-((2-methoxyethoxy)methoxy)-2-methylpropyl)trimethoxysilane obtained in Material Synthesis Example 1, and 30.83 g of acetone were charged. Into the mixed solution, 6.76 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer A (corresponding to a polymer containing the unit structures shown in Formula (C-1)) had a weight average molecular weight Mw of 1,600 in terms of polystyrene by GPC.

Synthesis Example 2

Into a 200-ml flask, 14.58 g (70% by mol) of tetraethoxysilane, 2.60 g (15% by mol) of methyltriethoxysilane, 0.99 g (5% by mol) of phenyltrimethoxysilane, 1.41 g (5% by mol) of (3-((2-methoxyethoxy)methoxy)-2-methylpropyl)trimethoxysilane obtained in Material Synthesis Example 1, and 30.83 g of acetone were charged. To the mixed solution, 6.85 g of 0.01 mol/l hydrochloric acid was added dropwise with stifling with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer B (corresponding to a polymer containing the unit structures shown in Formula (C-1)) had a weight average molecular weight Mw of 1,360 in terms of polystyrene by GPC.

Synthesis Example 3

Into a 200-ml flask, 14.58 g (70% by mol) of tetraethoxysilane, 3.57 g (20% by mol) of methyltriethoxysilane, 0.99 g (5% by mol) of phenyltrimethoxysilane, 1.40 g (5% by mol) of (3-(methoxymethoxy)-2-methylpropyl)triethoxysilane obtained in Material Synthesis Example 2, and 30.81 g of acetone were charged. To the mixed solution, 6.76 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer C (corresponding to a polymer containing the unit structures shown in Formula (C-2)) had a weight average molecular weight Mw of 1,400 in terms of polystyrene by GPC.

Synthesis Example 4

Into a 200-ml flask, 14.58 g (70% by mol) of tetraethoxysilane, 3.57 g (20% by mol) of methyltriethoxysilane, 1.29 g (5% by mot) of 4-(methoxymethoxy)-trimethoxysilylbenzene, 1.41 g (5% by mol) of (3-((2-methoxyethoxy)methoxy)-2-methylpropyl)trimethoxysilane obtained in Material Synthesis Example 1, and 30.83 g of acetone Were charged. To the mixed solution, 6.76 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer D (corresponding to a polymer containing the unit structures shown in Formula (C-3)) had a weight average molecular weight Mw of 1,600 in terms of polystyrene by GPC.

Synthesis Example 5

Into a 200-ml flask, 14.58 g (70% by mol) of tetraethoxysilane, 3.21 g (18% by mol) of methyltriethoxysilane, 0.99 g (5% by mol) of phenyltrimethoxysilane, 1.41 g (5% by mol) of (3-((2-methoxyethoxy)methoxy)-2-methylpropyl)trimethoxysilane obtained in Material Synthesis Example 1, 1.52 g (2% by mol) of 3-(triethoxysilyl)propyl-succinic anhydride, and 30.29 g of acetone were charged. Into the mixed solution, 6.65 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 40 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer E (corresponding to a polymer containing the unit structures shown in Formula (C-4)) had a weight average molecular weight Mw of 1,800 in terms of polystyrene by GPC.

Synthesis Example 6

Into a 200-ml flask, 14.58 g (70% by mol) of tetramethoxysilane, 0.99 g (5% by mol) of phenyltrimethoxysilane, 7.06 g (25% by mol) of (3-((2-methoxyethoxy)methoxy)-2-methylpropyl)trimethoxysilane obtained in Material Synthesis Example 1, and 30.83 g of acetone were charged. Into the mixed solution, 6.76 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer F (corresponding to a polymer containing the unit structures shown in Formula (C-5)) had a weight average molecular weight Mw of 1,510 in terms of polystyrene by GPC.

Synthesis Example 7

Into a 200-ml flask, 14.58 g (70% by mol) of tetraethoxysilane, 2.76 g (15% by mol) of methyltriethoxysilane, 0.99 g (5% by mol) of phenyltrimethoxysilane, 1.41 g (5% by mol) of (3-((2-methoxyethoxy)methoxy)-2-methylpropyl)trimethoxysilane obtained in Material Synthesis Example 1, 1.18 g (5% by mol) of 3-glycidyloxypropyltrimethoxysilane, and 30.48 g of acetone were charged. To the mixed solution, 6.69 g of 0.07 mol/l nitric, acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer G (corresponding to a polymer containing the unit structures shown in Formula (C-6)) had a weight average molecular weight Mw of 1,490 in terms of polystyrene by GPC.

Comparative Synthesis Example 1

Into a 200-ml flask, 14.58 g (70% by mol) of tetraethoxysilane, 4.46 g (25% by mol) of methyltriethoxysilane, 0.99 g (5% by mol) of phenyltrimethoxysilane, and 30.05 g of acetone were charged. Into the mixed solution, 6.67 g of 0.01 mmol/1 hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 40 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer a (corresponding to a polymer containing the unit structures shown in Formula (F-1)) had a weight average molecular weight Mw of 1,500 in terms of polystyrene by GPC.

Formula (F-1)

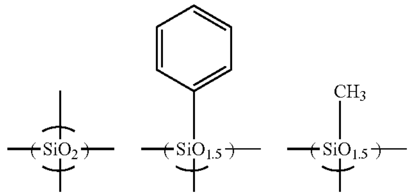

Comparative Synthesis Example 2

Into a 200-ml flask, 14.58 g (70% by mot) of tetraethoxysilane, 4.46 g (25% by mol) of methyltriethoxysilane, 1.29 g (5% by mol) of 4-(methoxymethoxy)-trimethoxysilylbenzene, and 30.83 g of acetone were charged. Into the mixed solution, 6.67 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer b (corresponding to a polymer containing the unit structures shown in Formula (F-2)) had a weight average molecular weight Mw of 1,550 in terms of polystyrene by GPC.

Formula (F-2)

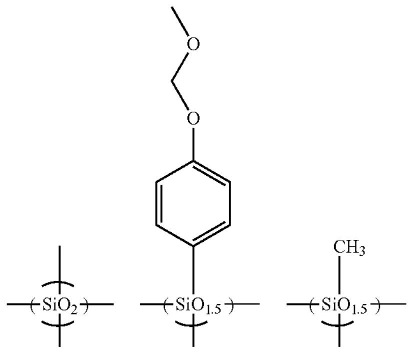

Comparative Synthesis Example 3

Into a 200-ml flask, 14.58 g (70% by mol) of tetraethoxysilane, 3.57 g (20% by mol) of methyltriethoxysilane, 0.99 g (5% by mol) of phenyltrimethoxysilane, 2.36 g (10% by mol) of 4-(triethoxysilyl)butan-1-01, and 30.92 g of acetone were charged. Into the mixed solution, 6.85 g of 0.01 mol/l hydrochloric acid was added dropwise with stirring with a magnetic stirrer. After the addition, the flask was transferred into an oil bath controlled at 85° C. and the mixture was reacted for 240 minutes under heat and reflux. Then, the reaction solution was cooled to room temperature, and to the reaction solution, 42 g of propylene glycol monomethyl ether acetate was added. Methanol and ethanol that are reaction byproducts, water, and hydrochloric acid were removed under reduced pressure, and the remaining solution was concentrated to afford a solution of a hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether 20/80, whereby the concentration was adjusted to 15 percent by mass in terms of solid residue at 140° C. The obtained polymer c (corresponding to a polymer containing the unit structures shown in Formula (F-3)) had a weight average molecular weight Mw of 1,750 in terms of polystyrene by GPC.

Formula (F-3)

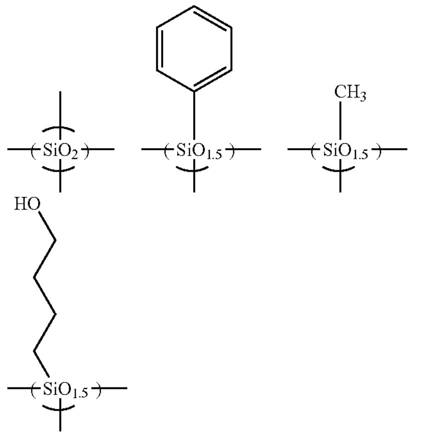

(Preparation of Resist Underlayer Film)

Each of the silicon-containing polymers (polymer A to polymer G and polymer a to polymer c) obtained in Synthesis Examples 1 to 7 and Comparative Synthesis Examples 1 to 3, an acid, a curing catalyst, an additive, solvents, and water were mixed in the ratio listed in Table 1. The mixture was filtered through a fluorine resin filter having a pore size of 0.1 μm and each solution of compositions for forming a resist underlayer film of Example 1 to Example 11 and Comparative Example 1 to Comparative Example 3 was prepared.

The acid, curing catalysts, additives, solvents, and water used in the compositions for forming a resist underlayer film of Examples and Comparative Examples are as below (see Table 1).

Acid: maleic acid (A)

Curing catalysts: triethylbenzylammonium chloride (A), N-(3-triethoxysilylpropyl-4,5-dihydroimidazole (B), monotriphenylsulfonium maleate (C)

Additives: bisphenol S (A), triphenylsulfonium trifluoromethanesulfonate (B)

Water: ultrapure water (A)

Solvents: propylene glycol monoethyl ether (A), propylene glycol monomethyl ether (B), propylene glycol monomethyl ether acetate (C)

In Table 1, numeric characters in parentheses mean the amounts added (parts by mass).

(Solvent Resistance Test)

Each composition for forming a resist underlayer film of Example 1 to Example 11 and Comparative Example 1 to Comparative Example 3 was applied onto a silicon wafer by spin coating and was baked on a hot plate at 240° C. for 1 minute to afford a resist underlayer film. Then, each of the coated wafers was immersed in propylene glycol monomethyl ether acetate (PGMEA) used as the solvent of an overcoating resist composition for 1 minute. A resist underlayer film having a change in the film thickness of 1 nm or less before and after the immersion was evaluated as "good (○)", whereas a resist underlayer film having a change in the film thickness of more than 1 nm was evaluated as "poor (x)". Table 2 shows the obtained results.

(Optical Constant Measurement)

Each composition for forming a resist underlayer film of Example 1 to Example 11 and Comparative Example 1 to Comparative Example 3 was applied onto a silicon wafer with a spinner. Each of the coated wafers was heated on a hot plate at 240° C. for 1 minute and a resist underlayer film (a film thickness of 0.05 μm) was formed. Then, the refractive index (n value) at a wavelength of 193 nm and the optical absorption coefficient (k value, also called attenuation coefficient) of each resist underlayer film were determined using a spectroscopic ellipsometer (manufactured by J. A. Woollam, VUV-VASE VU-302). Table 2 shows the obtained results.

(Measurement of Dry Etching Rate)

The solution of each composition for forming a resist underlayer film of Example 1 to Example 11 and Comparative Example 1 to Comparative Example 3 was applied onto a silicon wafer with a spinner. Each of the coated wafers was heated on a hot plate at 240° C. for 1 minute and a resist underlayer film (a film thickness of 0.08 μm (for measuring the etching rate with $CF_4$ gas) and a film thickness of 0.05 μm (for measuring the etching rate with $O_2$ gas)) was formed.

As a control sample for evaluating the oxygen-containing gas resistance, a composition for forming an organic underlayer film (see below) was applied onto a silicon wafer with a spinner and a coating film (a film thickness of 0.05 μm) was formed in a similar procedure.

Each of the underlayer film and the coating film was dry etched and the etching rate (etching speed: nm/rain) with a fluorine-containing gas was determined. Separately, as for the oxygen-containing gas ($O_2$ gas) resistance, the ratio of etching rate to that of the control sample, that is, [etching speed of

TABLE 1

| Example | Polymer | Acid | Curing catalyst | Additive | Water | Solvent |
|---|---|---|---|---|---|---|
| Example 1 | (A/2) | (A/0.02) | (A/0.006) | | (A/13) | (A/73, B/10, C/7) |
| Example 2 | (A/2) | (A/0.02) | (A/0.006) | (A/0.2) | (A/13) | (A/73, B/10, C/7) |
| Example 3 | (A/2) | (A/0.02) | (A/0.006) | (B/0.02) | (A/13) | (A/73, B/10, C/7) |
| Example 4 | (A/2) | (A/0.02) | (B/0.006) | (A/0.2) | (A/13) | (A/73, B/10, C/7) |
| Example 5 | (A/2) | (A/0.02) | (C/0.006) | (A/0.2) | (A/13) | (A/73, B/10, C/7) |
| Example 6 | (B/2) | (A/0.02) | (A/0.006) | (A/0.2) | (A/13) | (A/73, B/10, C/7) |
| Example 7 | (C/2) | (A/0.02) | (A/0.006) | (A/0.2) | (A/13) | (A/73, B/10, C/7) |
| Example 8 | (D/2) | (A/0.02) | (A/0.006) | (B/0.02) | (A/13) | (A/73, B/10, C/7) |
| Example 9 | (E/2) | (A/0.02) | (A/0.006) | (B/0.02) | (A/13) | (A/73, B/10, C/7) |
| Example 10 | (F/2) | (A/0.02) | (A/0.006) | (B/0.02) | (A/13) | (A/73, B/10, C/7) |
| Example 11 | (G/2) | (A/0.02) | (A/0.006) | (B/0.02) | (A/13) | (A/73, B/10, C/7) |
| Comparative Example 1 | (a/2) | (A/0.02) | (A/0.006) | | (A/13) | (A/73, B/10, C/7) |
| Comparative Example 2 | (b/2) | (A/0.02) | (A/0.006) | | (A/13) | (A/73, B/10, C/7) |
| Comparative Example 3 | (c/2) | (A/0.02) | (A/0.006) | | (A/13) | (A/73, B/10, C/7) |

each resist underlayer film of Examples 1 to 11 and Comparative Examples 1 to 3]/[etching speed of the organic underlayer film] was calculated. Table 2 shows the obtained results.

Etchers and etching gases used for measurement of dry etching rate are as below.

ES401 (manufactured by Nippon Scientific Co., Ltd.): $CF_4$

RIE-10NR (manufactured by Samco Inc.): $O_2$ (Preparation of Composition for Forming Organic Underlayer Film)

Into a 200-ml flask, 16.5 g of acenaphthylene, 1.5 g of 4-hydroxystyrene, and 60 g of 1,2-dichloroethane as a solvent were charged. To the mixture, 1 g of boron trifluoride was added as a polymerization initiator. The temperature was raised to 60° C. and the mixture was reacted for 24 hours. To the solution, 1 L of methanol and 500 g of water were added and the product was purified by reprecipitation. The obtained white solid was filtered and dried to afford 11 g of white polymer. The obtained polymer (corresponding to a polymer containing the unit structures shown in Formula (0-1)) was analyzed by $^{13}$C-NMR, GPC, which revealed a molar ratio of acenaphthylene:4-hydroxystyrene=86:14, Mw: 6000, and Mw/Mn=1.5.

The obtained polymer was dissolved in propylene glycol monomethyl ether acetate/cyclohexanone/γ-butyrolactone in a mass ratio of 15/80/5 and the solution was used as a composition for forming an organic underlayer film.

Formula (G-1)

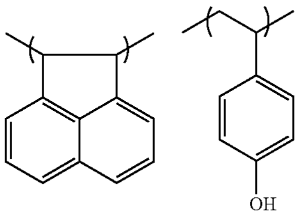

TABLE 2

| Composition used | Refractive index (n value) | Optical absorption coefficient (k value) | Solvent resistance | Fluorine-containing gas etching speed (nm/min) | Oxygen-containing gas resistance |
|---|---|---|---|---|---|
| Example 1 | 1.66 | 0.14 | ○ | 19.9 | 0.02 |
| Example 2 | 1.62 | 0.21 | ○ | 19.9 | 0.03 |
| Example 3 | 1.65 | 0.15 | ○ | 18.3 | 0.02 |
| Example 4 | 1.61 | 0.22 | ○ | 19.8 | 0.03 |
| Example 5 | 1.60 | 0.22 | ○ | 20.0 | 0.03 |
| Example 6 | 1.63 | 0.20 | ○ | 23.5 | 0.06 |
| Example 7 | 1.61 | 0.21 | ○ | 20.0 | 0.02 |
| Example 8 | 1.53 | 0.17 | ○ | 20.1 | 0.02 |
| Example 9 | 1.65 | 0.14 | ○ | 20.5 | 0.02 |
| Example 10 | 1.64 | 0.19 | ○ | 26.4 | 0.09 |
| Example 11 | 1.64 | 0.12 | ○ | 19.0 | 0.03 |
| Comparative Example 1 | 1.65 | 0.14 | ○ | 17.0 | 0.02 |
| Comparative Example 2 | 1.53 | 0.16 | ○ | 18.5 | 0.03 |
| Comparative Example 3 | 1.63 | 0.14 | ○ | 19.0 | 0.03 |

As listed in Table 2, each resist underlayer film formed from the compositions of Example 1 to Example 11 had excellent resistance with respect to the solvent. The refractive index (n value) was within a range of 1.60 to 1.66, and the optical absorption coefficient (k value) was within a range of 0.12 to 0.22. In other words, each resist underlayer film having a film thickness of 0.05 μm was revealed to have an optimum refractive index (n value) and optical absorption coefficient (k value) for providing sufficient anti-reflective effect.

As for the dry etching rate, the resist underlayer film formed from each composition of Example 1 to Example 11 had a high fluorine-containing gas etching rate with maximum of 26.4 nm/min (Example 10) and had a high oxygen-containing gas resistance with maximum of 0.09 (Example 10), and these results were equal to or higher than the etching rate and the resistance of the resist underlayer film formed from each composition of Comparative Examples.

(Resist Patterning Evaluation 1)

The composition (the composition including the polymer containing the unit structures shown in Formula (G-1)) for forming an organic underlayer film was applied onto a silicon wafer, then the coated substrate was heated on a hot plate at 215° C. for 1 minute, and an organic underlayer film (A layer) having a film thickness of 200 nm was formed.

Onto the organic underlayer film, each composition for forming a resist underlayer film of Example 1 to Example 11 and Comparative Example 1 to Comparative Example 3 was applied, then the coated substrate was heated on a hot plate at 215° C. for 1 minute, and a resist underlayer film (B layer) was formed. The resist underlayer film (B layer) formed from each composition of Example 1 to Example 6, Example 8 to Example 11, and Comparative Example 1 to Comparative Example 3 had a film thickness of 45 nm, whereas the resist underlayer film (B layer) formed from the composition of Example 7 had a film thickness of 50 nm.

Onto each resist underlayer film, a commercially available photoresist solution (manufactured by JSR Corporation, trade name AR2772JN) was applied with a spinner, then the coated substrate was heated on a hot plate at 100° C. for 1 minute, and a photoresist film (C layer) having a film thickness of 100 nm was formed.

Subsequently, each substrate was exposed to light using NSR-S307E scanner manufactured by Nikon Corporation (having a wavelength of 193 nm, NA, σ: 0.85, 0.93/0.85) through a mask designed so that the photoresist would have a line width and line spacing of 0.065 μm, that is, a dense line with 0.065 μm line and space (L/S)=1/1 would be formed after development. Then, the substrate was baked on a hot plate at 105° C. for 60 seconds. After the substrate was cooled, the development was carried out using an aqueous tetramethylammonium hydroxide solution (alkali developer) having a concentration of 2.38% by mass for 60 seconds to form a positive pattern on the resist underlayer film (B layer).

In a similar manner, the (A layer), the (B layer), and the (C layer) were formed, followed by exposure to light in the same condition. Then, each substrate was baked on a hot plate at 105° C. for 60 seconds. After the substrate was cooled cooling, the development was carried out using butyl acetate (solvent developer) for 60 seconds to form a negative pattern on the resist underlayer film (B layer).

An obtained photoresist pattern without large pattern exfoliation and undercut was evaluated as good. Table 3 shows the obtained results.

TABLE 3

| Composition used | Alkali development | Solvent development |
|---|---|---|
| Example 1 | Poor (pattern exfoliation) | Good (some undercut) |
| Example 2 | Poor (pattern exfoliation) | Good |
| Example 3 | Poor (pattern exfoliation) | Good |

TABLE 3-continued

| Composition used | Alkali development | Solvent development |
|---|---|---|
| Example 4 | Poor (pattern exfoliation) | Good |
| Example 5 | Poor (pattern exfoliation) | Good |
| Example 6 | Poor (pattern exfoliation) | Good |
| Example 7 | Poor (pattern exfoliation) | Good |
| Example 8 | Poor (pattern exfoliation) | Good |
| Example 9 | Poor (pattern exfoliation) | Good |
| Example 10 | Poor (pattern exfoliation) | Good (some pattern falling) |
| Example 11 | Poor (pattern exfoliation) | Good |
| Comparative Example 1 | Good | Poor (pattern falling) |
| Comparative Example 2 | Good | Poor (pattern falling) |
| Comparative Example 3 | Good | Poor (pattern falling) |

(Resist Patterning Evaluation 2)

The composition (the composition including the polymer containing the unit structures shown in Formula (G-1)) for forming an organic underlayer film was applied onto a silicon wafer, then the coated substrate was heated on a hot plate at 215° C. for 1 minute, and an organic underlayer film (A layer) having a film thickness of 200 nm was formed.

Onto the organic underlayer film, each composition for forming a resist underlayer film of Example 1 to Example 11 and Comparative Example 1 to Comparative Example 3 was applied, then the coated substrate was heated on a hot plate at 215° C. for 1 minute, and a resist underlayer film (B layer) was formed. The resist underlayer film (B layer) formed from each composition of Example 1 to Example 6, Example 8 to Example 11, and Comparative Example 1 to Comparative Example 3 had a film thickness of 45 nm, whereas the resist underlayer film (B layer) formed from the composition of Example 7 had a film thickness of 50 nm.

Onto each resist underlayer film, a commercially available photoresist solution (manufactured by Fujifilm Corporation, trade name FAiRS-9521NT05) was applied with a spinner, then the coated substrate was heated on a hot plate at 100° C. for 1 minute, and a photoresist film (C layer) having a film thickness of 100 nm was formed.

Subsequently, each substrate was exposed to light using NSR-S307B scanner manufactured by Nikon Corporation (having a wavelength of 193 nm, NA, σ: 0.85, 0.93/0.85) through a mask designed so that the photoresist would have a line width and line spacing of 0.065 μm, that is, a dense line with 0.065-μm line and space (L/S)=1/1 would be formed after development. Then, the substrate was baked on a hot plate at 105° C. for 60 seconds. After the substrate was cooled, the development was carried out using an aqueous tetramethylammonium hydroxide solution (alkali developer) having a concentration of 2.38% by mass for 60 seconds to form a positive pattern on the resist underlayer film (B layer).

In a similar manner, the (A layer), the (B layer), and the (C layer) were formed, followed by exposure to light in the same condition. Then, each substrate was baked on a hot plate at 105° C. for 60 seconds. After the substrate was cooled, the development was carried out using butyl acetate (solvent developer) for 60 seconds to form a negative pattern on the resist underlayer film (B layer).

An obtained photoresist pattern without large pattern exfoliation and undercut was evaluated as good. Table 4 shows the obtained results.

TABLE 4

| Example | Alkali development | Solvent development |
|---|---|---|
| Example 1 | Poor (pattern exfoliation) | Good (some undercut) |
| Example 2 | Poor (pattern exfoliation) | Good |
| Example 3 | Poor (pattern exfoliation) | Good |
| Example 4 | Poor (pattern exfoliation) | Good |
| Example 5 | Poor (pattern exfoliation) | Good |
| Example 6 | Poor (pattern exfoliation) | Good |
| Example 7 | Poor (pattern exfoliation) | Good |
| Example 8 | Poor (pattern exfoliation) | Good |
| Example 9 | Poor (pattern exfoliation) | Good |
| Example 10 | Poor (pattern exfoliation) | Good (some pattern falling) |
| Example 11 | Poor (pattern exfoliation) | Good |
| Comparative Example 1 | Good | Poor (pattern falling) |
| Comparative Example 2 | Good | Poor (pattern falling) |
| Comparative Example 3 | Good | Poor (pattern falling) |

As listed in Table 3 and Table 4, in a resist film formed on an underlayer film formed using the composition of the present invention, a fine resist shape can be obtained by solvent development.

INDUSTRIAL APPLICABILITY

In the lithography using a multilayer film including, on a substrate, an organic underlayer film, the silicon-containing resist underlayer film of the present application, and a solvent-developable resist in this order, a resist pattern is formed by solvent development of the resist, and then the resist underlayer film and the organic underlayer film are dry etched. The resist is treated with a solvent developer (organic solvent) not with an alkali developer (aqueous alkali solution), which can afford a good pattern shape. The present invention provides a composition for forming a resist underlayer film useful in such a process.

The invention claimed is:

1. A composition for forming an underlayer film for a solvent-developable resist, the composition comprising:

a hydrolyzable organosilane having a silicon atom bonded to an organic group containing a protected aliphatic alcohol group, a hydrolysate of the hydrolyzable organosilane, a hydrolysis-condensation product of the hydrolyzable organosilane, or a combination thereof; and a solvent;

wherein:

the silicon atom is present in a ratio of 0.1 to 40% by mol based on a total amount of silicon atoms in the composition;

the hydrolysable organosilane is an organosilane of Formula (1):

$$R^1{}_aR^2{}_bSi(R^3)_{4-(a+b)} \qquad \text{Formula (1)}$$

where:

$R^1$ is a monovalent organic group containing a protected aliphatic alcohol group and is bonded to the silicon atom in Formula (1) though a Si—C bond:

$R^2$ is an alkyl group, an aryl group, a halogenated alkyl group, a halogenated aryl group, an alkenyl group, or a monovalent organic group having an epoxy group, an acryloyl group, a methacryloyl group, a mercapto group, or a cyano group, and is bonded to the silicon atom in Formula (1) through a Si—C bond;

$R^3$ is an alkoxy group, an acyloxy group, or a halogen atom;
a is an integer of 1 or 2:
b is an integer of 0 or 1; and
a+b is an integer of 1 or 2; and
the organic group containing the protected aliphatic alcohol group is an organic group of Formula (2):

$$—R^4—O—R^5 \quad \text{Formula (2)}$$

where:
$R^4$ is a $C_{1-10}$ alkylene group; and
$R^5$ is a methyl group to which one or more divalent groups are bonded, the one or more divalent groups being selected from the group consisting of a $C_{1-10}$ alkylene group and an ether group.

2. The composition for forming an underlayer film according to claim 1, further comprising a combination of the hydrolyzable organosilane of Formula (1) and at least one silicon-containing compound, a hydrolysate of the combination, or a hydrolysis-condensation product of the combination;
wherein the at least one silicon-containing compound is selected from the group consisting of a silicon-containing compound of Formula (3) and a silicon-containing compound of Formula (4):

$$R^6_aSi(R^7)_{4-a} \quad \text{Formula (3)}$$

$$[R^8_cSi(R^9)_{3-c}]_2Y_b \quad (4)$$

where:
$R^6$ is an unsubstituted or substituted alkyl group, an unsubstituted or substituted aryl group, a halogenated alkyl group, a halogenated aryl group, an alkenyl group, or a monovalent organic group having an epoxy group, an acryloyl group, a methacryloyl group, a mercapto group, or a cyano group and is bonded to the silicon atom in Formula (3) through a Si—C bond;
$R^7$ is an alkoxy group, an acyloxy group, or a halogen atom;
a is an integer of 0 to 3;
$R^8$ is an alkyl group;
$R^9$ is an alkoxy group, an acyloxy group, or a halogen atom;
Y is an alkylene group or an arylene group;
b is an integer of 0 or 1;
c is an integer of 0 or 1; and
when b=0, a Si—Si single bond is formed.

3. The composition for forming the underlayer film according to claim 2, wherein the composition comprises the hydrolysis-condensation product of the hydrolyzable organosilane of Formula (1) the hydrolysis-condensation product of the hydrolyzable organosilane of Formula (1) and the silicon-containing compound of Formula (3) as a polymer.

4. The composition for forming an underlayer film according to claim 1, further comprising water.

5. A resist underlayer film on a substrate, the resist underlayer film being produced by applying the composition for forming an underlayer film as claimed in claim 1 onto a semiconductor substrate and baking the composition.

6. A method for producing a semiconductor device, the method comprising:
applying the composition for forming a resist underlayer film as claimed in claim 1 onto a semiconductor substrate and baking the composition to form a resist underlayer film;
applying a resist composition onto the underlayer film to form a resist film;
exposing the resist film to light;
developing the resist after exposure with a solvent to produce a resist pattern;
etching the resist underlayer film based on the resist pattern; and
fabricating the semiconductor substrate based on the patterned resist film and resist underlayer film.

7. A method for producing a semiconductor device, the method comprising:
forming an organic underlayer film on a semiconductor substrate;
applying the composition for forming a resist underlayer film as claimed in claim 1 onto the organic underlayer film and baking the composition to form a resist underlayer film;
applying a resist composition onto the underlayer film to form a resist film;
exposing the resist film to light;
developing the resist after exposure with a solvent to produce a resist pattern;
etching the resist underlayer film based on the resist pattern;
etching the organic underlayer film based on the patterned resist underlayer film; and
fabricating the semiconductor substrate based on the patterned resist film, resist underlayer film, and organic underlayer film.

* * * * *